(12) United States Patent
Nada et al.

(10) Patent No.: US 10,527,938 B2
(45) Date of Patent: Jan. 7, 2020

(54) METHOD FOR PRODUCING ELECTRICAL WIRING MEMBER AND ELECTRICAL WIRING MEMBER

(71) Applicant: NISSHA PRINTING CO., LTD., Kyoto-shi, Kyoto (JP)

(72) Inventors: Hideaki Nada, Kyoto (JP); Hiroaki Uefuji, Kyoto (JP); Hirotaka Shigeno, Kyoto (JP); Yoshihiro Sakata, Kyoto (JP); Yuki Matsui, Kyoto (JP); Hisaya Takayama, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 158 days.

(21) Appl. No.: 15/523,452

(22) PCT Filed: Oct. 22, 2015

(86) PCT No.: PCT/JP2015/079789
§ 371 (c)(1),
(2) Date: May 1, 2017

(87) PCT Pub. No.: WO2016/072274
PCT Pub. Date: May 12, 2016

(65) Prior Publication Data
US 2017/0307974 A1    Oct. 26, 2017

(30) Foreign Application Priority Data

Nov. 5, 2014  (JP) .................................. 2014-225611
Mar. 27, 2015 (JP) .................................. 2015-067616

(51) Int. Cl.
*G03F 7/038* (2006.01)
*G06F 3/044* (2006.01)
(Continued)

(52) U.S. Cl.
CPC .............. *G03F 7/038* (2013.01); *G03F 7/094* (2013.01); *G03F 7/11* (2013.01); *G06F 3/044* (2013.01);
(Continued)

(58) Field of Classification Search
CPC . G03F 7/038; G03F 7/094; G03F 7/11; G06F 3/044; G06F 3/04103;
(Continued)

(56) References Cited

U.S. PATENT DOCUMENTS 8,692,130 B2 * 4/2014 Okumura .............. G06F 1/1626
174/250
9,122,336 B1 * 9/2015 Lai .......................... G06F 3/041
(Continued)

FOREIGN PATENT DOCUMENTS

JP    2011-082211    4/2011
JP    2012-094115    5/2012
(Continued)

OTHER PUBLICATIONS

International Search Report, dated Dec. 22, 2015 (Dec. 22, 2015), 2 pages.

*Primary Examiner* — Steven T Sawyer
*Assistant Examiner* — Paresh H Paghadal
(74) *Attorney, Agent, or Firm* — Rankin, Hill & Clark LLP

(57) ABSTRACT

[Object] To provide a method for producing an electrical wiring member having a layered structure of copper wiring and a blackening layer and to provide the electrical wiring member through a search for a material for the blackening layer, the material being etched at a rate close to that for the copper wiring under conditions where etching controllability is ensured. [Solution] A method for producing an electrical wiring member according to the present invention (Continued)

includes a step of forming, on at least one main surface of a substrate, a layered film 6 of a Cu layer 3 and CuNO-based blackening layers (2a and 2b); a step of forming a resist layer 4a in a predetermined region on the layered film 6; and a step of removing a partial region of the layered film 6 by bringing the layered film 6 into contact with an etchant.

2 Claims, 17 Drawing Sheets

(51) Int. Cl.
*H01B 5/14* (2006.01)
*G03F 7/09* (2006.01)
*G03F 7/11* (2006.01)
*H01B 13/00* (2006.01)
*H05K 9/00* (2006.01)

(52) U.S. Cl.
CPC .............. *H01B 5/14* (2013.01); *H01B 13/003* (2013.01); *H05K 9/0088* (2013.01); *H05K 9/0096* (2013.01); *G06F 2203/04103* (2013.01)

(58) Field of Classification Search
CPC .............. G06F 3/04107; H05K 9/0088; H05K 9/0096; H01B 13/003; H01B 5/14; C01B 21/0821
See application file for complete search history.

(56) References Cited

U.S. PATENT DOCUMENTS

| | | | | |
|---|---|---|---|---|
| 2004/0222003 | A1* | 11/2004 | Kim | ............ H01J 11/12 174/357 |
| 2006/0088690 | A1* | 4/2006 | Arakawa | ............ B32B 3/12 428/138 |
| 2006/0163197 | A1* | 7/2006 | Arakawa | ............ B32B 3/30 216/41 |
| 2007/0046187 | A1* | 3/2007 | Tsai | ............ H01L 27/322 313/506 |
| 2007/0122649 | A1* | 5/2007 | Lee | ............ H01L 29/458 428/674 |
| 2012/0241199 | A1* | 9/2012 | Kobayashi | ............ G06F 3/044 174/250 |
| 2013/0153390 | A1* | 6/2013 | Lee | ............ G06F 3/044 200/600 |
| 2013/0215067 | A1 | 8/2013 | Hwang et al. | |
| 2015/0002791 | A1* | 1/2015 | Nam | ............ G02B 5/3058 349/96 |
| 2015/0169104 | A1* | 6/2015 | Park | ............ G06F 3/044 345/174 |
| 2015/0205326 | A1 | 7/2015 | Lim et al. | |
| 2015/0223326 | A1* | 8/2015 | Lim | ............ H05K 3/16 345/174 |
| 2015/0316290 | A1* | 11/2015 | Liu | ............ F24S 70/30 126/676 |
| 2015/0355738 | A1* | 12/2015 | Lee | ............ G06F 3/041 345/173 |
| 2015/0373844 | A1* | 12/2015 | Yoon | ............ G06F 3/041 345/173 |
| 2017/0349998 | A1* | 12/2017 | Yoshinari | ............ C23C 14/06 |
| 2018/0224960 | A1* | 8/2018 | Park | ............ G06F 3/041 |
| 2018/0275801 | A1* | 9/2018 | Nakayama | ............ G06F 3/044 |

FOREIGN PATENT DOCUMENTS

| | | | | |
|---|---|---|---|---|
| JP | 2013-127767 | | 6/2013 | |
| JP | 2013-540331 | | 10/2013 | |
| JP | 2013-239722 | | 11/2013 | |
| JP | 2014-512455 | | 5/2014 | |
| JP | 2014-150118 | | 8/2014 | |
| KR | 101165948 | B1 * | 7/2012 | |
| TW | 201423771 | | 6/2014 | |
| TW | 201426767 | | 7/2014 | |
| WO | WO-2016048042 | A1 * | 3/2016 | ............ G06F 3/041 |

\* cited by examiner

FIG. 34

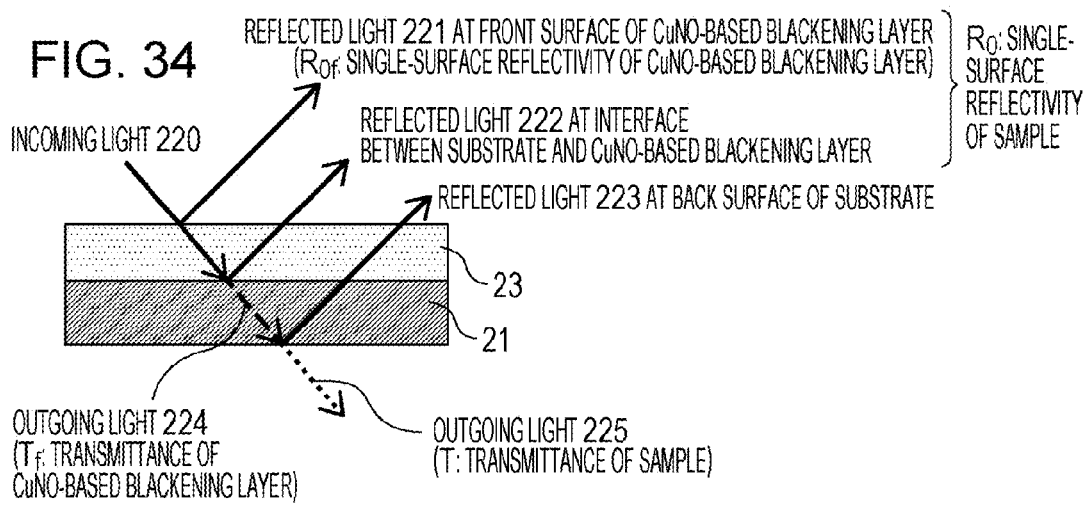

REFLECTED LIGHT 221 AT FRONT SURFACE OF CuNO-BASED BLACKENING LAYER
($R_{0f}$: SINGLE-SURFACE REFLECTIVITY OF CuNO-BASED BLACKENING LAYER)
REFLECTED LIGHT 222 AT INTERFACE BETWEEN SUBSTRATE AND CuNO-BASED BLACKENING LAYER
$R_0$: SINGLE-SURFACE REFLECTIVITY OF SAMPLE

INCOMING LIGHT 220
REFLECTED LIGHT 223 AT BACK SURFACE OF SUBSTRATE

OUTGOING LIGHT 224 ($T_f$: TRANSMITTANCE OF CuNO-BASED BLACKENING LAYER)
OUTGOING LIGHT 225 (T: TRANSMITTANCE OF SAMPLE)

FIG. 35

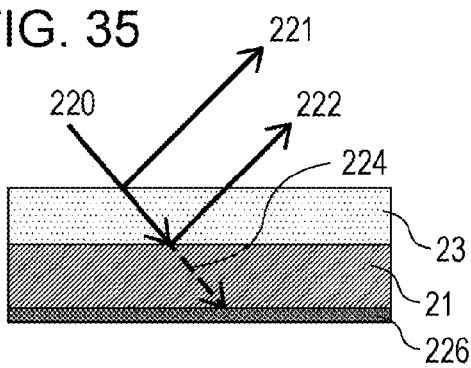

FIG. 36

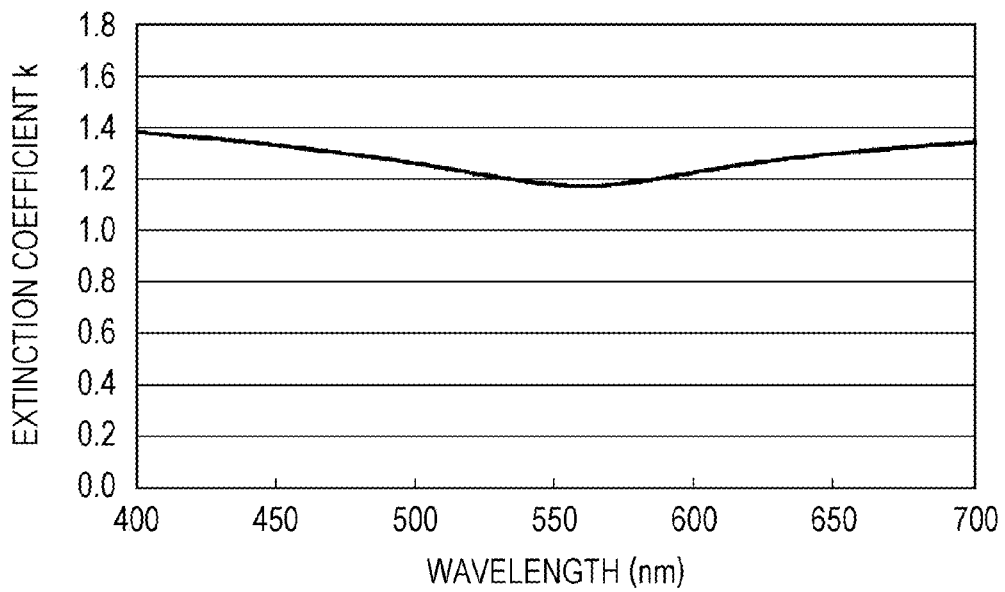

METHOD FOR PRODUCING ELECTRICAL WIRING MEMBER AND ELECTRICAL WIRING MEMBER

TECHNICAL FIELD

The present invention relates to a method for producing an electrical wiring member and an electrical wiring member, for example, relates to an electrical wiring member formed in a touch panel or an electromagnetic shielding member.

BACKGROUND ART

In recent years, with increases in the functionality and use of display devices, there has been an increasing need for improvements in touch panels and electromagnetic shielding members attached to the surfaces of display devices. In particular, since small devices such as smartphones and tablet terminals are used in the state where the users are close to the display devices, there has been an increasing demand for improvements in the viewability of display devices. For example, in the field of touch panels attached to the surfaces of display devices, instead of conductive transparent materials (ITO, IZO, and the like), which have been mainly used as wiring materials, use of copper wiring has been studied, the copper wiring being excellent in terms of cost balance and having a resistance one or two orders of magnitude lower than the resistances of ITO, IZO, and the like. In the case of using copper wiring, when the touch panel is viewed from the outside, the copper wiring is noticeable because of reflection by the surface of the copper wiring. This is prevented by subjecting the surface of copper wiring to blackening treatment. For the same purpose, also in the field of electromagnetic shielding members, the surfaces of copper wiring patterns are subjected to blackening treatment.

There are various production methods including blackening treatment during production processes of touch panels and electromagnetic shielding members. For example, there are the following known methods.

For example, Patent Literature 1 describes a method for producing a transparent conductive material, the method including a step of preparing a layered body in which a conductive pattern layer composed of a conductive composition containing silver particles and a binder resin is formed on a one surface side of a transparent substrate, and a step of forming a blackening layer by bringing the layered body into contact with a metal blackening treatment solution that is a hydrochloric acid solution containing tellurium dissolved, the hydrochloric acid solution having a tellurium concentration (concentration in terms of oxide) of 0.01 to 0.45 wt % and having a hydrochloric acid concentration of 0.05 to 8 wt %.

In addition, Patent Literature 2 describes a method in which a pretreatment such as degreasing or acid treatment of a conductive substrate is performed in a pretreatment tank; subsequently, metal is deposited on the conductive substrate in a plating tank; and the conductive substrate is further sequentially passed through a rinsing tank, a blackening treatment tank, a rinsing tank, an anticorrosive treatment tank, and a rinsing tank to thereby blacken the surface of the metal deposited on the conductive substrate.

Furthermore, Patent Literature 3 describes a method for producing a touch panel characterized by forming, by the following steps, a conductive mesh fine wire of an upper sensor electrode, the wire including a metal or alloy layer and a blackening layer formed on the layer: the method includes a step of forming a metal layer or alloy layer on a transparent substrate, a step of forming an electrode pattern in the metal layer or alloy layer, a step of forming a blackening layer over the metal layer or alloy layer, and a step of removing the blackening layer from non-electrode portions.

CITATION LIST

Patent Literature

PTL 1: Japanese Unexamined Patent Application Publication No. 2011-82211
PTL 2: Japanese Unexamined Patent Application Publication No. 2013-239722
PTL 3: Japanese Unexamined Patent Application Publication No. 2012-94115

SUMMARY OF INVENTION

Technical Problem

In the case of the technique of using a layered structure of copper wiring (Cu layer) and a blackening layer, when the copper wiring and the blackening layer that are materials differing from each other in chemical properties are patterned by etching, because of a difference in etching rates between the copper wiring and the blackening layer, imbalance in their amounts of etching occurs, which is problematic. For example, (A) when an etching rate for the copper wiring is higher than an etching rate for the blackening layer, a large area of the Cu layer tends to be removed, so that the copper wiring is narrowed, which results in an increase in the electric resistance. On the other hand, (B) when the etching rate for the blackening layer is higher than the etching rate for the copper wiring, a large area of the blackening layer tends to be removed, so that a portion of the surface of the copper wiring is exposed without being covered by the blackening layer. Thus, suppression of reflection by the surface of copper wiring, the suppression being supposed to be achieved with the blackening layer, is not sufficiently achieved. An etchant for patterning the copper wiring and another etchant for patterning the blackening layer may be separately used. However, in this case, the number of etching steps is increased and also the steps become complicated, which are big problems.

In general, compared with copper wiring, a blackening layer is less likely to be etched. This results in (A) above, that is, the copper wiring is narrowed and the electric resistance is increased. Improvements may be made in the etchant. However, for example, in the case of using a highly corrosive etchant, etching controllability is decreased. For this reason, when this etchant is employed for copper wiring having a narrow line width demanded in recent years, the line width as designed cannot be ensured.

Under such circumstances, an object of the present invention is to provide a method for producing an electrical wiring member having a layered structure of copper wiring and a blackening layer and to provide the electrical wiring member through a search for a material for the blackening layer, the material being etched at a rate close to that for the copper wiring under conditions where etching controllability is ensured.

Solution to Problem

The inventors of the present invention performed tests in which wet etching was performed to remove partial regions of various films having a layered structure of a Cu layer as the material for copper wiring and a blackening layer. As a result, the inventor has found CuNO-based compositions (CuNO, CuO, and CuN) as good materials for the blackening layer, the materials being etched at a rate close to that for Cu under conditions where etching controllability is ensured.

A method for producing an electrical wiring member according to the present invention, the method enabling the above-described object to be achieved, includes a step of forming, on at least one main surface of a substrate, a layered film of a Cu layer and a CuNO-based blackening layer; a step of forming a resist layer in a predetermined region on the layered film; and a step of removing a partial region of the layered film by bringing the layered film into contact with an etchant. Since the Cu layer and the CuNO-based blackening layer are etched at rates close to each other, after etching for removing a partial region of the layered film of the Cu layer and the CuNO-based blackening layer, the width of the remaining Cu layer and the width of the remaining CuNO-based blackening layer can be made close to each other. This enables a problem to be addressed, the problem relating to an increase in the electric resistance of the Cu layer due to excessive narrowing of the Cu layer, or relating to exposure of the Cu layer due to excessive narrowing of the blackening layer.

In the method for producing an electrical wiring member, the CuNO-based blackening layer is preferably a CuNO blackening layer. This is because the etching rates for the copper wiring and the blackening layer can be made closer to each other.

In the method for producing an electrical wiring member, furthermore, the CuNO blackening layer is preferably a $CuN_xO_y$ layer ($0.01 \leq x \leq 0.05$, $0.01 \leq y \leq 0.35$).

In the method for producing an electrical wiring member, the step of forming the CuNO-based blackening layer is preferably performed by Cu-sputtering in an atmosphere at least containing nitrogen gas and oxygen gas. This facilitates formation of the CuNO-based blackening layer that is a Cu layer with incorporated nitrogen and oxygen atoms.

In the method for producing an electrical wiring member, preferably, on the at least one main surface of the substrate, a first CuNO-based blackening layer is formed; on the first CuNO-based blackening layer, a Cu layer is formed; and on the Cu layer, a second CuNO-based blackening layer is formed.

In the method for producing an electrical wiring member, the total thickness of the CuNO-based blackening layer in the layered film is preferably 10 to 400 nm.

In the method for producing an electrical wiring member, the step of removing a partial region of the layered film is preferably performed such that the layered film is turned into a mesh pattern. The Cu layer and the CuNO-based blackening layer are formed so as to have a mesh pattern, to thereby increase the light transmittance of the electrical wiring member, which results in a decrease in the reflectivity.

An electrical wiring member according to the present invention, the member enabling the above-described object to be achieved, includes a substrate; and a layered film of a Cu layer and a CuNO-based blackening layer formed on at least one main surface of the substrate, the layered film being a patterned film.

In the electrical wiring member, the CuNO-based blackening layer is preferably a CuNO blackening layer.

In the electrical wiring member, the CuNO blackening layer is preferably a $CuN_xO_y$ layer ($0.01 \leq x \leq 0.05$, $0.01 \leq y \leq 0.35$).

An apparatus for producing an electrical wiring member, the apparatus enabling the above-described object to be achieved, includes a sealed housing; a substrate unwinding reel and a substrate winding reel that are formed within the sealed housing; and a first chamber, a second chamber adjacent to the first chamber, and a third chamber adjacent to the second chamber that are formed within the sealed housing, wherein a Cu target material is disposed in each of the first to third chambers, and an inlet for oxygen gas and/or nitrogen gas is formed in at least one of the first to third chambers.

In the apparatus for producing an electrical wiring member, the inlet is desirably formed in the first and third chambers.

In addition, the inventors of the present invention studied, in the case of forming various blackening layers by sputtering under varied conditions in terms of introduction amounts of oxygen gas and nitrogen gas, the extinction coefficient and the reflectivity of each blackening layer as described below in EXAMPLES. As a result, the inventors have found that use of a blackening layer having an extinction coefficient of 1.0 or more and 1.8 or less obtained by controlling the composition ratio of the gases introduced, enables a decrease in the reflectivity. The inventors also have found that, in addition to formation of such a blackening layer, formation of a dielectric layer thereon that has a refractive index different from that of the blackening layer enables a further decrease in the reflectivity.

Specifically, the method for producing an electrical wiring member in this case has features that the method includes a step of forming, on at least one main surface of a substrate, a layered film in which a Cu layer and a CuNO-based blackening layer are sequentially formed; a step of forming a resist layer in a predetermined region on the layered film; a step of removing a region of the layered film not covered with the resist layer by bringing the layered film into contact with an etchant; and a step of forming a dielectric layer on the substrate and on the layered film having been patterned, wherein the CuNO-based blackening layer has an extinction coefficient of 1.0 or more and 1.8 or less in wavelengths of 400 nm to 700 nm. Since a method for producing an electrical wiring member according to the present invention employs, as a blackening layer, a CuNO-based blackening layer that is etched at a rate close to that for the Cu layer, after etching for removing a partial region of the layered film of the Cu layer and the CuNO-based blackening layer, the remaining Cu layer and the remaining CuNO-based blackening layer have widths close to each other. In addition, since a method for producing an electrical wiring member according to the present invention employs a CuNO-based blackening layer having an extinction coefficient of 1.0 or more and 1.8 or less in the visible-radiation wavelength region of 400 nm to 700 nm, a decrease in the reflectivity over the entirety of the wavelength region can be achieved. In addition, since the dielectric layer is formed on the substrate and on the layered film to suppress reflection of visible radiation, a reflectivity of 5% or less can be achieved.

In the method for producing an electrical wiring member in which a dielectric layer is formed so as to have a refractive index different from that of the blackening layer, the dielectric layer is preferably a $SiO_2$ layer, for example. This is because $SiO_2$ is easy to produce and is also easy to handle due to its stable structure.

An electrical wiring member according to the present invention, the member enabling the above-described object to be achieved, has features that the member includes a substrate; a patterned layered film in which, on at least one main surface of the substrate, a Cu layer and a CuNO-based blackening layer are sequentially formed; and a dielectric layer formed on the substrate and on the patterned layered film, wherein the CuNO-based blackening layer has an extinction coefficient of 1.0 or more and 1.8 or less in wavelengths of 400 nm to 700 nm. Since an electrical wiring member according to the present invention employs, as a blackening layer, a CuNO-based blackening layer that is etched at a rate close to that for the Cu layer, after etching for removing a partial region of the layered film of the Cu layer and the CuNO-based blackening layer, the remaining Cu layer and the remaining CuNO-based blackening layer have widths close to each other. In addition, since an electrical wiring member according to the present invention employs a CuNO-based blackening layer having an extinction coefficient of 1.0 or more and 1.8 or less in the visible-radiation wavelength region of 400 nm to 700 nm, a decrease in the reflectivity over the entirety of the wavelength region can be achieved. In addition, since the dielectric layer is formed on the substrate and on the layered film to suppress reflection of visible radiation, a reflectivity of 5% or less can be achieved.

In the electrical wiring member, the dielectric layer is preferably a $SiO_2$ layer, for example. This is because $SiO_2$ is easy to produce and is also easy to handle due to its stable structure.

In the electrical wiring member, the total thickness of the CuNO-based blackening layer and the dielectric layer is preferably 100 nm or less, for example. This is because, when the total thickness of the CuNO-based blackening layer and the dielectric layer is more than 100 nm, it becomes difficult for conductive particles within an ACF (anisotropic conductive film) to penetrate the CuNO-based blackening layer and the dielectric layer, the conductive particles being used for establishing an electrical connection and achieving mechanical bonding between the substrate such as an FPC (flexible printed circuit) and the Cu layer; thus, the electrical connection between the substrate and the Cu layer is less likely to be established.

Advantageous Effects of Invention

In the present invention, since a Cu layer and a CuNO-based blackening layer are etched at rates close to each other, after etching for removing a portion of the layered film of the Cu layer and the CuNO-based blackening layer, the width of the remaining Cu layer and the width of the remaining CuNO-based blackening layer are close to each other. This enables a problem to be addressed, the problem relating to an increase in the electric resistance due to excessive narrowing of the Cu layer, or relating to exposure of the Cu layer due to excessive narrowing of the blackening layer, and an increase in the amount of light reflected by the Cu layer. In addition, since the etching rates for the CuNO-based blackening layer and the Cu layer are close to each other, the conventional necessity of plural wet etching processes performed individually so as to correspond to one layer selected from the Cu layer and the blackening layer is eliminated.

BRIEF DESCRIPTION OF DRAWINGS

FIG. 34 is a conceptual view illustrating a method of measuring the single-surface reflectivity and transmittance of a sample according to the present invention.

FIG. 35 is a conceptual view illustrating a method of measuring the single-surface reflectivity and transmittance of a sample according to the present invention.

FIG. 36 is a graph of an extinction coefficient in the wavelengths of 400 nm to 700 nm in Example 1 according to the present invention.

DESCRIPTION OF EMBODIMENTS

Figure 1:
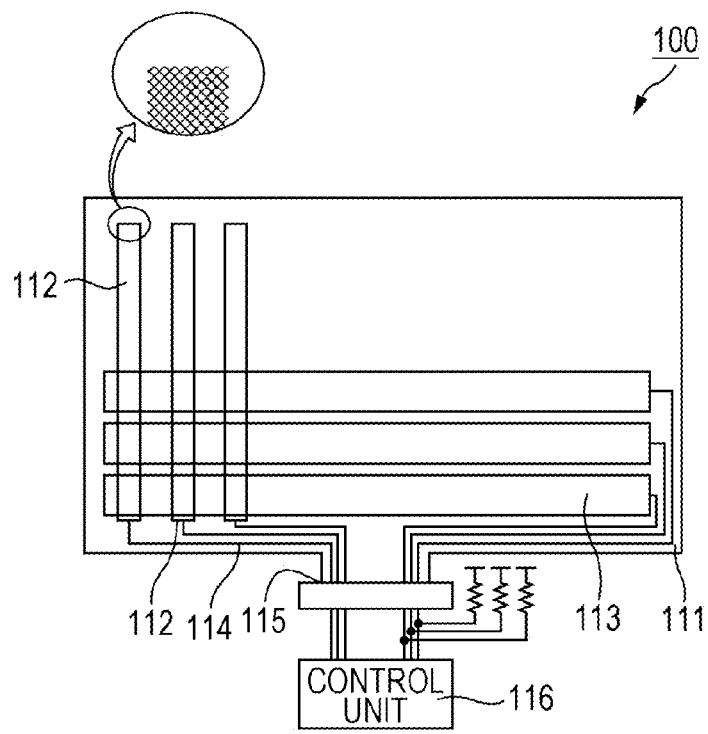
FIG. 1 is a plan view of a capacitance touch sensor according to an embodiment of the present invention.

Hereinafter, the present invention will be more specifically described on the basis of embodiments. However, the present invention is not at all limited by the embodiments described below. Modifications can be obviously made on the embodiments as long as they fit the spirit and scope described above and below. Such modifications are all encompassed in the technical scope of the present invention. Various members in the drawings are illustrated in dimension ratios for better understanding of features of the present invention, and may not be necessarily illustrated in actual dimension ratios.

Applications of the present invention are not limited to, for example, touch panels and electromagnetic shielding members. The present invention is applicable to electrical wiring members including CuNO-based blackening layers. However, the present invention will be described with reference to a capacitance touch sensor as an example.

FIG. 1 is a plan view of a capacitance touch sensor 100, which is an example of an electrical wiring member according to the present invention. As illustrated in FIG. 1, the capacitance touch sensor 100 according to this embodiment mainly includes, for example, a resin sheet 111 formed of polycarbonate; conductive parts 112 formed on the front surface of the resin sheet 111 and configured to detect vertical key inputting; conductive parts 113 formed on the back surface of the resin sheet 111 and configured to detect lateral key inputting; a connector part 115; and lead electrodes 114, which connect the conductive parts 112 and 113 to the connector part 115. The connector part 115 is connected to a control unit 116. Operations of the capacitance touch sensor 100 are controlled by the control unit 116. As illustrated in a partially enlarged view in FIG. 1, in order for the conductive parts 112 and 113 to transmit light, the conductive parts 112 and 113 are formed to have mesh patterns. Instead of such a mesh pattern, a striped pattern, a wave pattern constituted by wavy stripes, or a punching pattern including plural holes may also be employed.

The conductive parts 112 and 113 formed on the front and back of the resin sheet 111 are each constituted by a Cu layer. In order to suppress reflection of light by the Cu layer, a blackening layer is formed on each of the conductive parts 112 and 113. Such a configuration in which the conductive parts 112 and 113 are individually formed on the front and back of the resin sheet 111 is merely an example of a capacitance touch sensor to which the present invention is applicable. Hereinafter, the present invention including a step of forming a layered film of a Cu layer and a CuNO-based blackening layer on at least one main surface of the resin sheet 111 (substrate) will be described.

1. Regarding Control of Etching

A method for producing an electrical wiring member according to this embodiment includes (1-1) a step of forming a layered film of a Cu layer and a CuNO-based blackening layer on at least one main surface of a substrate; (1-2) a step of forming a resist layer in a predetermined region on the layered film; and (1-3) a step of removing partial regions of the layered film (a partial region of the Cu layer and a partial region of the CuNO-based blackening layer) by bringing an etchant into contact with the layered film. In the present invention, "CuNO-based blackening layer" is formed of a compound that contains Cu, N (nitrogen) and/or O (oxygen), and the balance being inevitable impurities; typically, such compositions are CuNO, $Cu_3N$, CuO, and $Cu_2O$.

In the step of bringing an etchant into contact with the layered film including the Cu layer and the CuNO-based blackening layer, since the CuNO-based blackening layer is also etched at a similar rate by wet etching, the Cu layer and the CuNO-based blackening layer are corroded to similar degrees by wet etching performed for a period. This enables a problem to be addressed, the problem relating to an increase in the electric resistance due to excessive narrowing of the Cu layer, or relating to exposure of the Cu layer due to excessive narrowing of the blackening layer, and an increase in the amount of light reflected by the Cu layer.

Incidentally, regarding the above-described steps, the order of performing the step of forming a Cu layer and the step of forming a CuNO-based blackening layer is not limited, and one of these steps may be performed prior to the other step. These steps are intended to form at least one Cu layer and at least one CuNO-based blackening layer, to thereby form a layered film of a Cu layer and a CuNO-based blackening layer on at least one main surface of the substrate.

Figure 2:
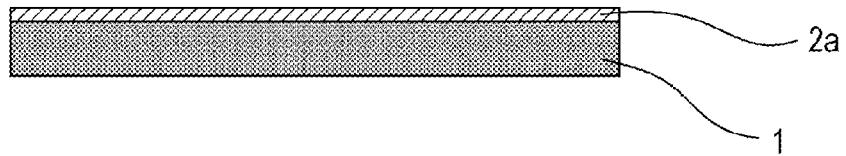
FIG. 2 is a step sectional view relating to a method for producing an electrical wiring member according to an embodiment of the present invention.
Figure 3:
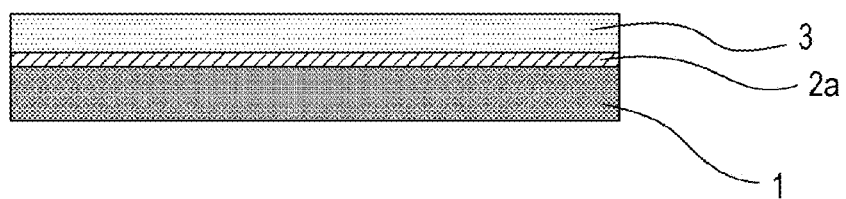
FIG. 3 is a step sectional view relating to a method for producing an electrical wiring member according to an embodiment of the present invention.
Figure 4:
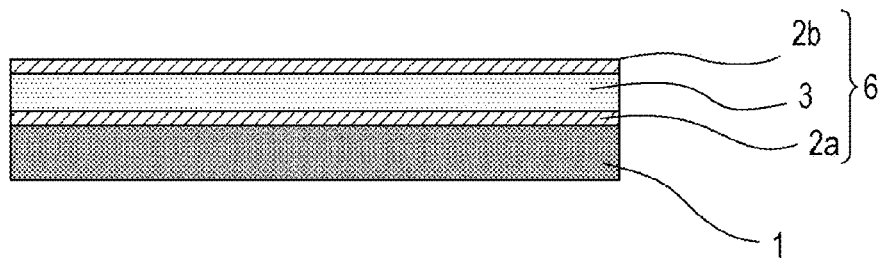
FIG. 4 is a step sectional view relating to a method for producing an electrical wiring member according to an embodiment of the present invention.

Hereinafter, a preferred example of a method for producing an electrical wiring member according to this embodiment will be described in detail with reference to drawings. FIGS. 2 to 4 are step sectional views corresponding to portions of the method for producing an electrical wiring member according to this embodiment.

(1-1) Step of Forming Layered Film of Cu Layer and CuNO-based Blackening Layer

As illustrated in FIG. 2, a first CuNO-based blackening layer 2a is first formed on at least one main surface of a substrate 1. Subsequently, as illustrated in FIG. 3, a Cu layer 3 is formed on the first CuNO-based blackening layer 2a. In addition, as illustrated in FIG. 4, a second CuNO-based blackening layer 2b is formed on the Cu layer 3. As a result of these steps, a layered film of the Cu layer and the CuNO-based blackening layers is formed on at least one main surface of the substrate 1. At least one CuNO-based blackening layer is included on at least one main surface of the substrate 1: as illustrated in FIG. 3, only one layer may be included; or, as illustrated in FIG. 4, two layers may be included. However, the total thickness of such CuNO-based blackening layers formed on at least one main surface of the substrate is preferably 10 to 400 nm, more preferably 18 to 200 nm, still more preferably 36 to 120 nm. The thickness of a single CuNO-based blackening layer is preferably 5 to 200 nm, more preferably 9 to 100 nm, still more preferably 18 to 60 nm.

Although such a blackening layer has a function of attenuating the intensity of internally propagating light, it mainly suppresses reflected light by means of interference of reflected visible radiation. In order to use such interference to decrease the intensity of reflected visible radiation, the thickness is preferably set to be in the above-described range. Hereafter, the first CuNO-based blackening layer 2a may be simply described as the CuNO-based blackening layer 2a, and the second CuNO-based blackening layer 2b may be simply described as the CuNO-based blackening layer 2b.

In order to ensure a necessary electric conductivity, the Cu layer 3 has a thickness of, for example, 20 nm or more, preferably 40 nm or more, more preferably 60 nm or more. However, when the Cu layer 3 has an excessively large thickness, etching thereof takes an excessively long time. Thus, the thickness is, for example, 2 μm or less, preferably 1 μm or less, more preferably 400 nm or less.

The material for the substrate 1 is not particularly limited as long as it is a non-conductive material. Examples of the material include polyethylene terephthalate resins (PET), aliphatic cyclic polyolefin resins (COP), glass, polycarbonate resins (PC), and acrylic resins (PMMA). When the electrical wiring member is used for a display device, the substrate 1 is desirably substantially transparent. The thickness of the substrate 1 is not particularly limited; however, the thickness is, for example, 15 μm to 200 μm, preferably 20 μm to 150 μm, more preferably 25 μm to 125 μm.

The methods for forming the Cu layer 3 and the CuNO-based blackening layers 2a and 2b are not particularly limited; such layers can be formed by, for example, a sputtering method, a vapor deposition method, or a CVD method, or can also be formed by modifying the surface of a Cu layer. In this embodiment, a method for forming the layered film by a sputtering method will be described as an example.

Figure 5:
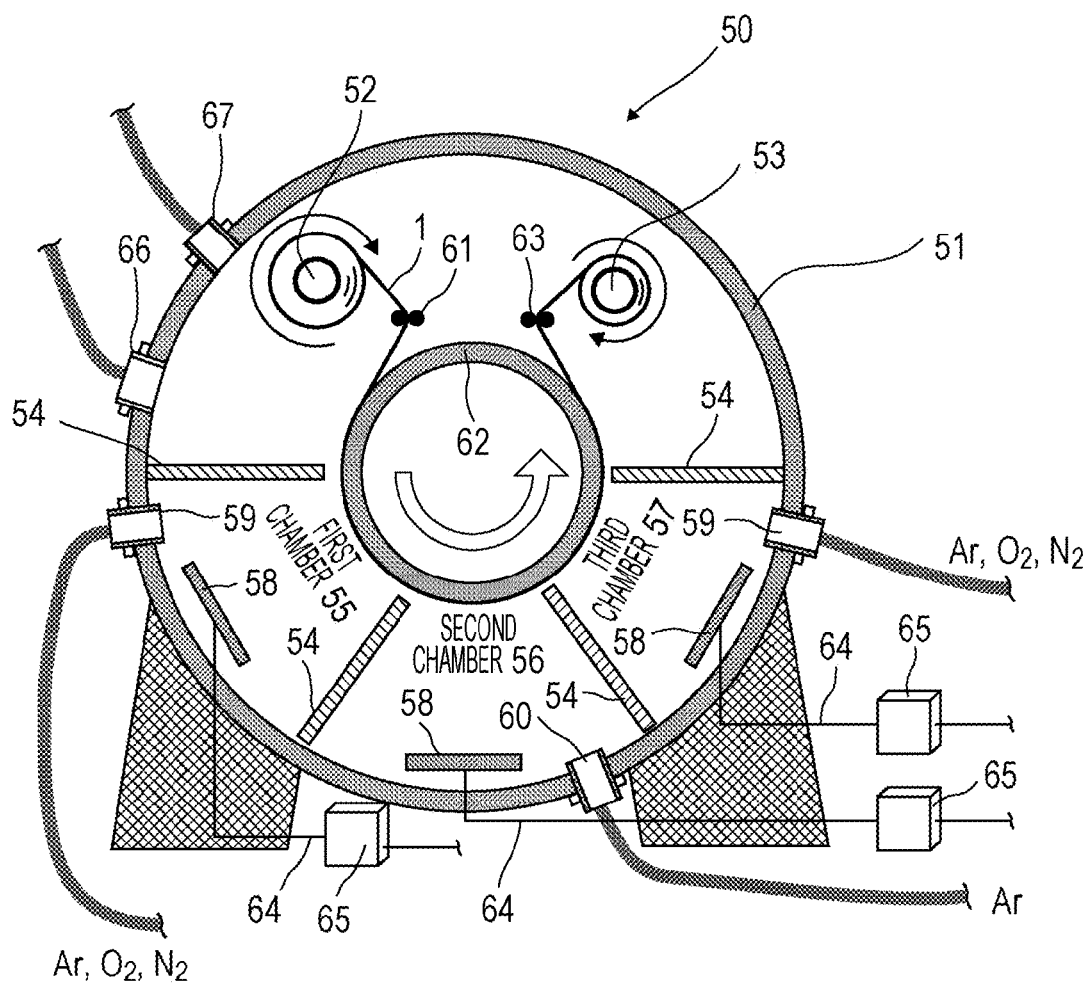
FIG. 5 is a sectional view of a sputtering apparatus applicable to a method for producing an electrical wiring member according to an embodiment of the present invention.

FIG. 5 is a sectional view of a sputtering apparatus 50 that is an apparatus for producing the electrical wiring member according to this embodiment. The sputtering apparatus 50 includes a sealed housing 51; a substrate unwinding reel 52 and a substrate winding reel 53 that are formed within the sealed housing 51; a first chamber 55, a second chamber 56 adjacent to the first chamber 55, and a third chamber 57 adjacent to the second chamber 56 that are formed within the sealed housing 51 and defined by partitions 54. In each of the first chamber 55 to the third chamber 57, a Cu target material 58 is disposed. In addition, in the first chamber 55 and the third chamber 57, inlets 59 for oxygen gas and/or nitrogen gas are formed. In the second chamber 56, an inlet 60 for argon gas is formed, the argon gas being made to impact on the Cu target material 58. Incidentally, the inlets 59 may also be used to supply argon gas. The inlets 59 and the inlet 60 may also be used to introduce, in addition to argon gas, hydrogen gas ($H_2$) in order to promote incorporation of nitrogen into the blackening layers. In addition, in the sealed housing 51, a low-vacuum suction port 66 and a high-vacuum suction port 67 are provided. The low-vacuum suction port 66 is connected to, for example, an oil rotary vacuum pump (not shown), so that the internal pressure of the sealed housing 51 can be rapidly reduced to an appropriate degree of vacuum. The high-vacuum suction port 67 is connected to, for example, a turbo-molecular pump (not shown), so that the internal pressure of the sealed housing 51 can be reduced to a high degree of vacuum at which sputtering can be performed.

In the substrate unwinding reel 52, the above-described substrate 1 is held in the form of a roll. The substrate 1 is sent from the substrate unwinding reel 52, via pinch rolls 61, an internal drum 62, and pinch rolls 63, and is finally wound by the substrate winding reel 53.

The Cu target materials 58 disposed in the first chamber 55 to the third chamber 57 are connected via lead wires 64 to controllers 65, so that predetermined potentials are applied thereto. The sputtering method may be DC sputtering of applying a direct voltage between two electrodes, RF sputtering involving radio-frequency application, magnetron sputtering, or ion-beam sputtering.

On the substrate 1 that is unwound from the substrate unwinding reel 52 and enters the first chamber 55, a Cu layer is formed by sputtering with the Cu target material 58. At this time, since oxygen gas and/or nitrogen gas is supplied through the inlet 59 into the first chamber 55, the layer formed on the substrate 1 is the CuNO-based blackening layer 2a, which is a Cu layer with incorporated oxygen (O) and/or nitrogen (N) atoms (FIG. 2).

Subsequently, on the substrate 1 that enters the second chamber 56, the Cu layer 3 is formed by sputtering with the Cu target material 58 (FIG. 3). Since only the inlet 60 for argon gas, which is an inert gas, is formed in the second chamber 56, oxygen and/or nitrogen is not basically incorporated into the Cu layer 3 (except for those inevitably incorporated).

Subsequently, on the substrate 1 that enters the third chamber 57, a Cu layer is formed by sputtering with the Cu target material 58. As in the first chamber 55, since oxygen gas and/or nitrogen gas is supplied through the inlet 59 to the third chamber 57, the layer formed on the substrate 1 is the CuNO-based blackening layer 2b, which is a Cu layer with incorporated oxygen (O) and/or nitrogen (N) atoms (FIG. 4). As a result of the above-described steps, the layered film 6 of the Cu layer 3 and the CuNO-based blackening layers (2a and 2b) is formed.

Figure 6:
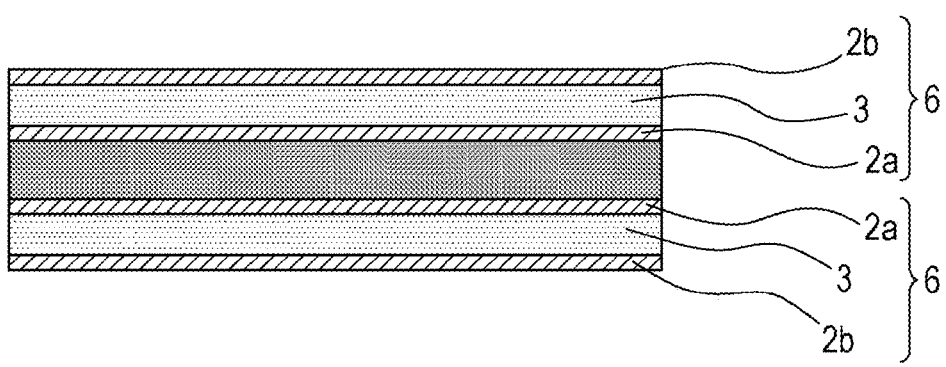
FIG. 6 is a step sectional view relating to a method for producing an electrical wiring member according to an embodiment of the present invention.

In the same manner as above, a layered film 6 of a Cu layer 3 and CuNO-based blackening layers (2a and 2b) can also be formed on the back surface side of the substrate 1. For example, the substrate roll having been wound around the substrate winding reel 53 after completion of the step in FIG. 4, is set to the substrate unwinding reel 52 such that the back surface side of the substrate 1 faces the Cu target materials 58. The substrate 1 is sent from the substrate unwinding reel 52, via the pinch rolls 61, the internal drum 62, and the pinch rolls 63, and finally set to the substrate winding reel 53. In this state, the sputtering apparatus 50 is operated, so that, as illustrated in FIG. 6, the layered film 6 can also be formed on the back surface side of the substrate 1.

From the viewpoint of effective use of a single production apparatus, as described above, the method of detaching a substrate roll from the substrate winding reel 53 and attaching it to the substrate unwinding reel 52 is preferably performed, for example. Alternatively, from the viewpoint of increasing the rate of producing the electrical wiring member, chambers configured to form films on the back surface side of the substrate 1 (for example, after the third chamber 57, a fourth chamber to a sixth chamber (not shown)) may be provided within the same sealed housing 51, or, in addition to the sputtering apparatus 50, another sputtering apparatus (not shown) configured to form films on the back surface side of the substrate 1 may be disposed.

In the above description, the inlets 59 for oxygen gas and/or nitrogen gas are formed in the first chamber 55 and the third chamber 57. This is intended to form the layered film 6 in the order of, as illustrated in FIG. 4, CuNO-based blackening layer 2a /Cu layer 3 CuNO-based blackening layer 2b. Depending on the order of forming layers on top of one another, the position of an inlet 59 may be appropriately changed to the second chamber 56, for example.

Figure 7:
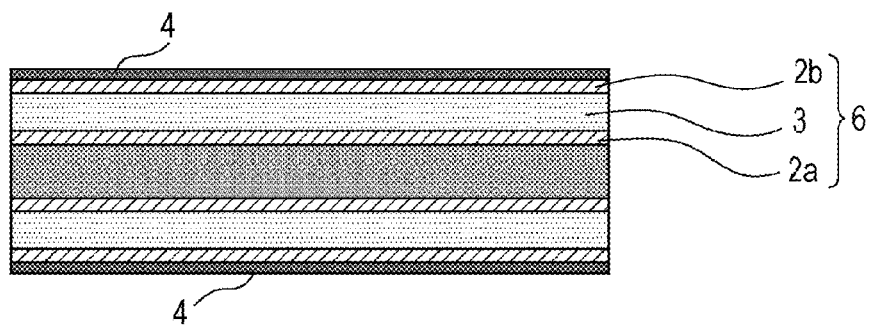
FIG. 7 is a step sectional view relating to a method for producing an electrical wiring member according to an embodiment of the present invention.
Figure 8:
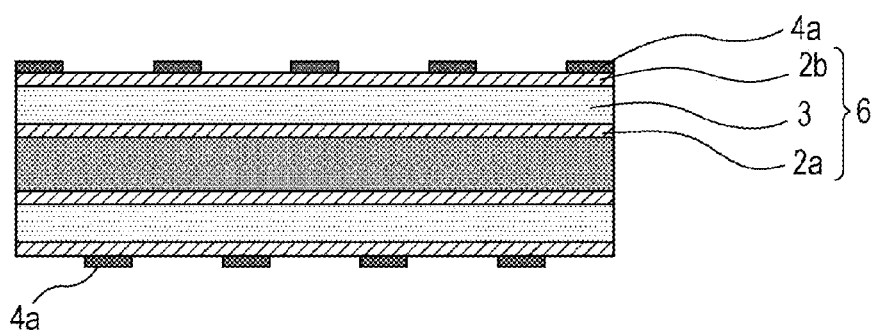
FIG. 8 is a step sectional view relating to a method for producing an electrical wiring member according to an embodiment of the present invention.

(1-2) Step of forming resist layer in predetermined region on layered film 6 FIGS. 7 and 8 are step sectional views corresponding to portions of the method for producing an electrical wiring member according to this embodiment. As illustrated in FIG. 7, photoresist layers 4 are first formed uniformly over the layered films 6. The material for the photoresist layers 4 is also not particularly limited; the material may be in semisolid form (paste form) or in solid form (film form).

Subsequently, as illustrated in FIG. 8, for example, a lithography process is used to pattern the photoresist layers 4. The step of partially removing the photoresist layers is typically achieved by irradiating portions of the photoresist layers with light, and removing, with a developer, the portions irradiated with light (positive photoresist), or removing, with a developer, portions not irradiated with light (negative photoresist).

(1-3) Step of Removing Portion of Layered Film 6

Figure 9:
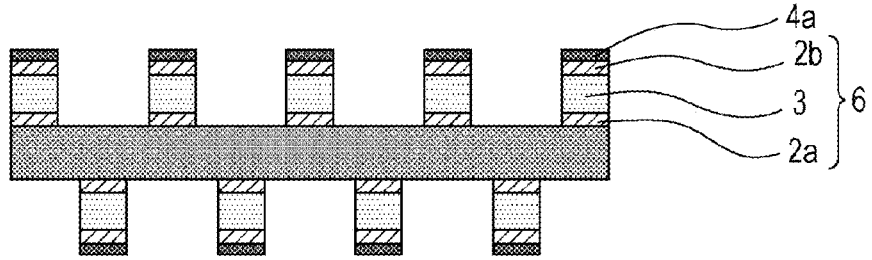
FIG. 9 is a step sectional view relating to a method for producing an electrical wiring member according to an embodiment of the present invention.

FIG. 9 is a step sectional view corresponding to a portion of the method for producing an electrical wiring member according to this embodiment. An etchant is brought into contact with the layered films 6 that are exposed without being covered by photoresist layers 4a, to thereby remove portions of the layered films 6 (portions of the Cu layers and portions of the CuNO-based blackening layers). The etchant used is not particularly limited as long as it is capable of etching the Cu layers and also the CuNO-based blackening layers. However, in order to appropriately ensure etching controllability, the etching rate needs to be controlled. In order to control the etching rate, for example, adjustments in terms of temperature, concentration, and pH are desirably performed.

Figure 16:
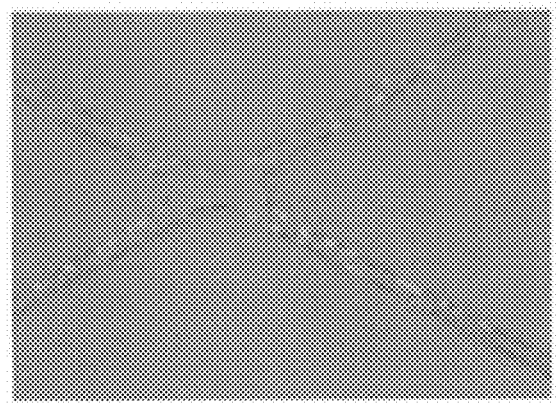
FIG. 16 is an optical microscopic photograph for the surface of an electrical wiring member corresponding to FIG. 9.

In this embodiment, CuNO-based blackening layers (2a and 2b) are employed as blackening layers, so that there is a small etching-rate difference between these layers and Cu; as illustrated in FIG. 9, the Cu layers 3 and the CuNO-based blackening layers (2a and 2b) are etched at similar rates, so that the holes are neatly formed so as to extend perpendicularly to the layered films 6. In contrast, when blackening layers that are not CuNO-based are employed, there is a large etching-rate difference between these layers and Cu, so that the etching profile in FIG. 8 is less likely to be provided. For reference, FIG. 16 is an optical microscopic photograph of the surface of the electrical wiring member corresponding to FIG. 9. The widths of the Cu layers 3 are substantially equal to the widths of the CuNO-based blackening layers (2a and 2b), and light reflected by the Cu layers 3 is not observed.

Figure 10:
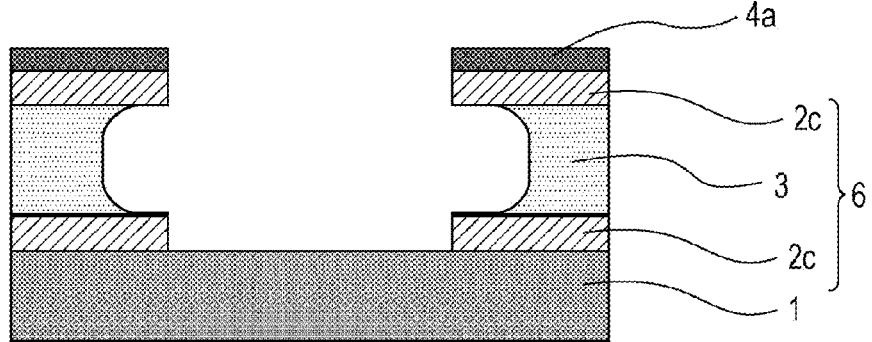
FIG. 10 is a step sectional view relating to a method for producing an electrical wiring member with a conventional blackening layer.
Figure 11:
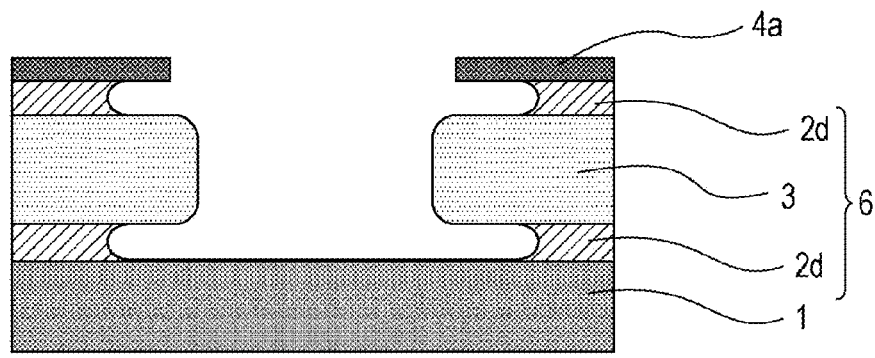
FIG. 11 is a step sectional view relating to another method for producing an electrical wiring member with a conventional blackening layer.

FIG. 10 and FIG. 11 are step sectional views illustrating enlarged profiles of etched layered films 6 in which, as the blackening layers, layers other than the CuNO-based blackening layers (2a and 2b) are employed (layers etched at a rate lower than that for Cu are temporarily referred to as "blackening layers 2c"; and layers etched at a rate higher than that for Cu are temporarily referred to as "blackening layers 2d").

Figure 17:
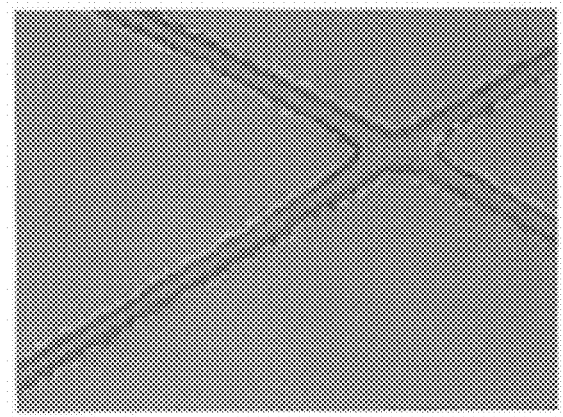
FIG. 17 is an optical microscopic photograph for the surface of an electrical wiring member corresponding to FIG. 10.

In the example of FIG. 10 in which, as the blackening layers, the blackening layers 2c (etched at a rate lower than that for Cu) are employed, while etching of the blackening layers 2c does not rapidly proceed, etching of the Cu layer 3 has proceeded. A wide area of the Cu layer 3 is removed, so that the copper wiring is narrowed, which results in an increase in the electric resistance. For reference, FIG. 17 is an optical microscopic photograph of the surface of the electrical wiring member corresponding to FIG. 10. Compared with the width of the Cu layer 3, the blackening layers 2c remaining have a large width.

Figure 18:
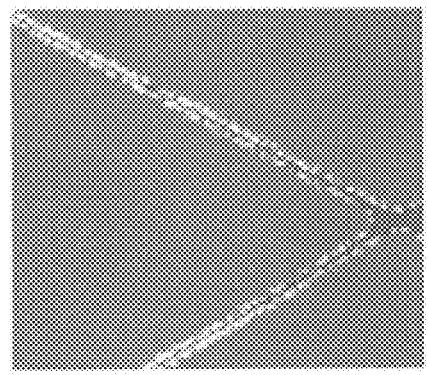
FIG. 18 is an optical microscopic photograph for the surface of an electrical wiring member corresponding to FIG. 11.

Conversely, in the example of FIG. 11 in which, as the blackening layers, the blackening layers 2d (etched at a rate higher than that for Cu) are employed, etching of the blackening layers 2d has proceeded, so that the upper or lower main surface of the Cu layer 3 is exposed. Thus, suppression of reflection by the surface of the Cu layer (copper wiring), the suppression being supposed to be achieved with the blackening layers, is not sufficiently achieved. For reference, FIG. 18 is an optical microscopic photograph of the surface of the electrical wiring member corresponding to FIG. 11. The blackening layers 2d are narrowed to a small width, so that the Cu layer 3 is exposed and light reflected by the Cu layer 3 is observed.

Figure 12:
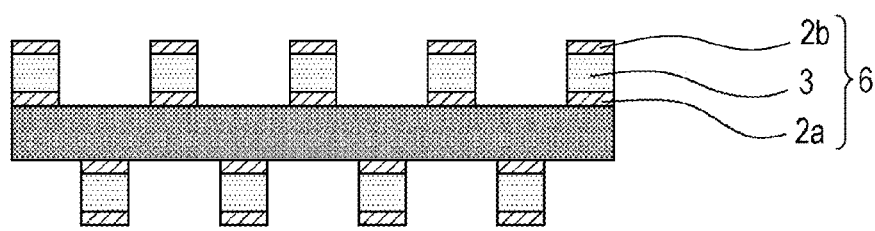
FIG. 12 is a step sectional view relating to a method for producing an electrical wiring member according to an embodiment of the present invention.
Figure 13:
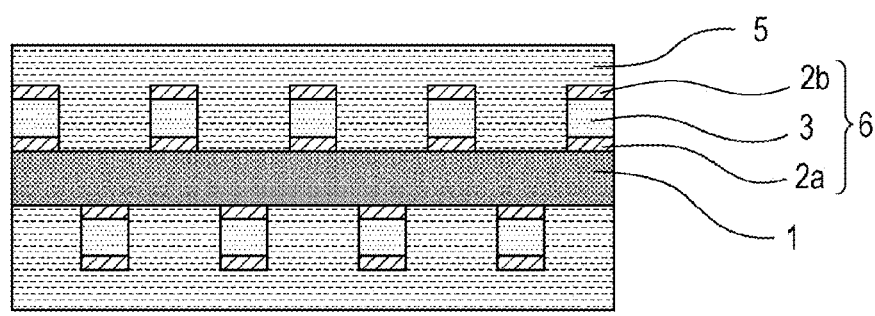
FIG. 13 is a step sectional view relating to a method for producing an electrical wiring member according to an embodiment of the present invention.

As a final treatment, preferably, as illustrated in FIG. 12, a cleaning solution is used to remove the remaining photoresist layers 4a. In addition, preferably, as illustrated in FIG. 13, the substrate 1 and the layered films 6 are covered with protective layers 5, to thereby protect the electrical wiring member from moisture and oxygen in the outside.

Incidentally, the reflectivity in the case of forming the CuNO-based blackening layers (2a and 2b) is lower than a reflectivity (the reflectivity of the Cu layer 3) in the case of not forming the CuNO-based blackening layers (2a and 2b). This is because, in addition to the above-described effect of self-weakening of reflected light due to interference, the CuNO-based blackening layers (2a and 2b) themselves have the effect of attenuating the intensity of light. The reflectivity in the case of forming the CuNO-based blackening layers (2a and 2b) is, for example, 60% or less of the reflectivity of the Cu layer 3, more preferably 30% or less, still more preferably 15% or less.

Figure 14:
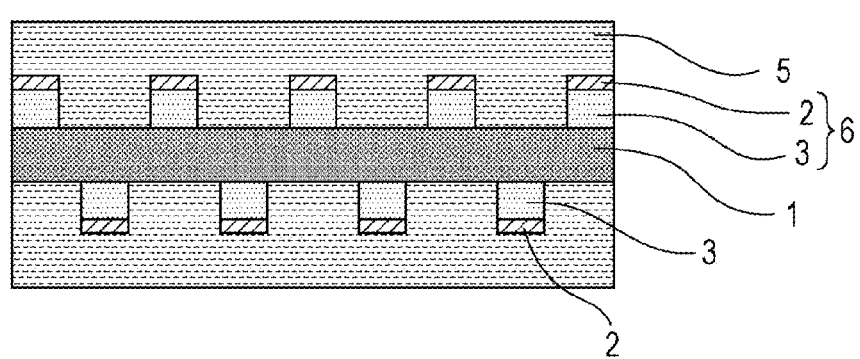
FIG. 14 is a sectional view of an electrical wiring member according to another embodiment of the present invention.

The layered films 6 of the electrical wiring member according to this embodiment have the layer structure of CuNO-based blackening layer 2a/Cu layer 3/CuNO-based blackening layer 2b. However, the layer structure is not limited to this, and another layer structure including at least one Cu layer and at least one CuNO-based blackening layer can be similarly employed. FIG. 14 is a sectional view of an electrical wiring member according to another embodiment of the present invention. As illustrated in FIG. 14, CuNO-based blackening layers 2 may be formed only on sides opposite to the substrate 1. In this case, since the CuNO-based blackening layers 2 on the sides opposite to the substrate 1 come into contact with an etchant for a long time, use of CuNO-based blackening layers 2 etched at a rate close to that for the Cu layers does not necessarily lead to formation of straight-profile holes. CuNO-based blackening layers 2 that are etched at a rate 2 to 5 times higher than the etching rate for the Cu layers 3 are preferably employed.

Figure 15:
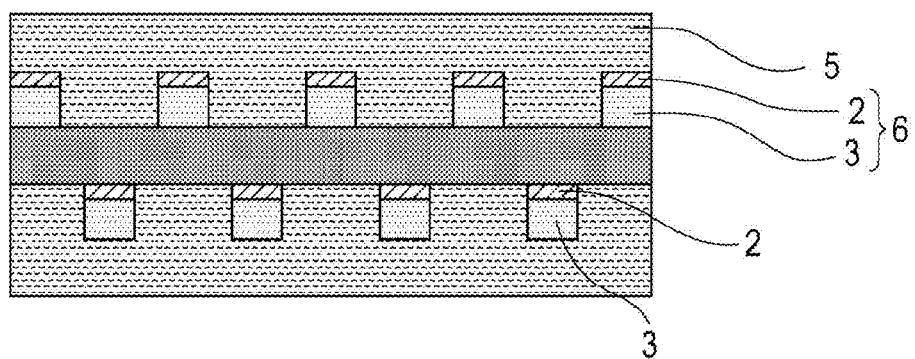
FIG. 15 is a sectional view of an electrical wiring member according to still another embodiment of the present invention.

FIG. 15 is a sectional view of an electrical wiring member according to still another embodiment of the present invention. As illustrated in FIG. 15, the CuNO-based blackening layers 2 may be formed only on the viewer's side with respect to the Cu layers 3.

2. Regarding Greater Suppression of Reflectivity

The electrodes subjected to blackening treatment in PTLs 1 to 3 as related art, provide the effect of decreasing the reflectivity to visible radiation of some wavelengths, but does not suppress the reflectivity to visible radiation over the entirety of its wavelength region. Thus, there has been room for improving the method of performing a treatment of decreasing reflectivity in order to obtain electrodes that provide higher viewability.

Under such circumstances, the inventors of the present invention provide a method for producing an electrical wiring member in which, in addition to the above-described features that good etching controllability is ensured and also the imbalance in the amounts of etching between the copper wiring and the blackening layer is addressed, the reflectivity can be suppressed over the entirety of the wavelength region of visible radiation, and provide the electrical wiring member.

In this case, the electrical wiring member employs a CuNO-based blackening layer having an extinction coefficient of 1.0 or more and 1.8 or less in the visible-radiation wavelength region of 400 nm to 700 nm, so that the reflectivity can be suppressed over the entirety of the wavelength region. In addition, in order to suppress reflection of visible radiation, a dielectric layer is formed on the substrate and on the CuNO-based blackening layer, so that the layered film can be made to have a reflectivity of 5% or less.

The conductive parts 112 and 113 formed on the front and back of the resin sheet 111 in FIG. 1 are each constituted by a Cu layer. In order to suppress reflection of light by the Cu layer, a CuNO-based blackening layer and a dielectric layer are formed on each of the conductive parts 112 and 113. Such a configuration in which the conductive parts 112 and 113 are formed on the front and back of the resin sheet 111 is merely an example of a capacitance touch sensor to which the present invention is applicable. Hereinafter, the present invention including a step of forming a layered film of a Cu layer, a CuNO-based blackening layer, and a dielectric layer on at least one main surface of the resin sheet 111 (substrate) will be described.

A method for producing an electrical wiring member according to this embodiment includes (2-1) a step of forming a layered film in which a Cu layer and a CuNO-based blackening layer are sequentially formed on at least one main surface of a substrate; (2-2) a step of forming a resist layer in a predetermined region on the CuNO-based blackening layer; (2-3) a step of removing a region of the layered film not covered with the resist layer by bringing the layered film of the Cu layer and the CuNO-based blackening layer into contact with an etchant; and (2-4) a step of forming a dielectric layer on the substrate and on the layered film having been patterned, wherein the CuNO-based blackening layer has an extinction coefficient of 1.0 or more and 1.8 or less in wavelengths of 400 nm to 700 nm.

In addition, an electrical wiring member according to an embodiment of the present invention includes a substrate; a patterned layered film in which a Cu layer and a CuNO-based blackening layer are sequentially formed on at least one main surface of the substrate; and a dielectric layer formed on the substrate and on the patterned layered film, wherein the CuNO-based blackening layer has an extinction coefficient of 1.0 or more and 1.8 or less in wavelengths of 400 nm to 700 nm.

A method for producing an electrical wiring member and an electrical wiring member according to the present invention employ, as a blackening layer, a CuNO-based blackening layer that is etched at a rate close to that for a Cu layer. Thus, after etching for removing partial regions of the Cu layer and the CuNO-based blackening layer, the remaining Cu layer and the remaining CuNO-based blackening layer have widths close to each other. In addition, since the CuNO-based blackening layer having an extinction coefficient of 1.0 or more and 1.8 or less in the visible-radiation wavelength region of 400 nm to 700 nm is employed, the reflectivity can be suppressed over the entirety of the wavelength region. In addition, since the dielectric layer is formed on the substrate and on the CuNO-based blackening layer to suppress reflection of visible radiation, a reflectivity of 5% or less can be achieved.

In the present invention, the CuNO-based blackening layer is formed of a compound that contains Cu, N (nitrogen) and/or O (oxygen), and the balance being inevitable impurities; typically, such compositions are CuNO, $Cu_3N$, CuO, and $Cu_2O$. Although the blackening layer has a function of attenuating the intensity of internally propagating light, it mainly suppresses reflected light by means of interference of reflected visible radiation.

The dielectric layer increases the transmittance for visible radiation to thereby decrease the reflectivity. The minimum reflection wavelength of the dielectric layer depends on the refractive index of its material and the thickness of the dielectric layer. In the present invention, a CuNO-based blackening layer is combined with a dielectric layer that has a refractive index different from that of the blackening layer, so that the reflectivity is suppressed to low values in the visible-radiation wavelengths of 400 nm to 700 nm.

A CuNO-based blackening layer according to the present invention has an extinction coefficient of 1.0 or more and 1.8 or less in the wavelengths of 400 nm to 700 nm. The CuNO-based blackening layer is formed so as to have a nitrogen content of 0.8 at % to 4 at % and an oxygen content of 4 at % to 10 at %, so that the CuNO-based blackening layer has an extinction coefficient of 1.0 or more and 1.8 or less.

Figure 22:
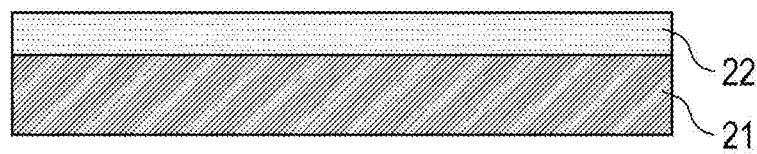
FIG. 22 is a step sectional view relating to a method for producing an electrical wiring member according to an embodiment of the present invention.
Figure 23:
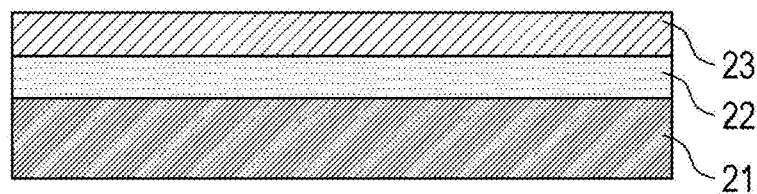
FIG. 23 is a step sectional view relating to a method for producing an electrical wiring member according to an embodiment of the present invention.

Hereinafter, a preferred example of a method for producing an electrical wiring member employing a CuNO-based blackening layer having an extinction coefficient of 1.0 or more and 1.8 or less according to an embodiment will be described in detail with reference to drawings. FIG. 22 and FIG. 23 are step sectional views corresponding to portions of the method for producing an electrical wiring member according to this embodiment.

(2-1) Step of Forming Layered Film in which Cu Layer and CuNO-based Blackening Layer are Sequentially Formed As illustrated in FIG. 22, a Cu layer 22 is formed on at least one main surface of a substrate 21. Subsequently, as illustrated in FIG. 23, on the Cu layer 22, a CuNO-based blackening layer 23 is formed. As a result of these steps, a layered film of the Cu layer 22 and the CuNO-based blackening layer 23 is formed on at least one main surface of the substrate 21. As illustrated in FIG. 23, only one CuNO-based blackening layer 23 may be included, or two CuNO-based blackening layers 23 may be included. However, the total thickness of such CuNO-based blackening layers formed on at least one main surface of the substrate is preferably 5 nm to 150 nm, more preferably 12 nm to 115 nm, still more preferably 18 nm to 80 nm.

Although such a blackening layer has a function of attenuating the intensity of internally propagating light, it mainly suppresses reflected light by means of interference of reflected visible radiation. When the total thickness of the CuNO-based blackening layer and the dielectric layer is more than 100 nm, it becomes difficult for conductive particles within an ACF to penetrate the CuNO-based blackening layer and the dielectric layer, the conductive particles being used for establishing an electrical connection and achieving mechanical bonding between the substrate such as an FPC and the Cu layer; thus, the electrical connection between the substrate and the Cu layer is less likely to be established. For this reason, the CuNO-based blackening layer 23 preferably has a thickness in the above-described range.

The CuNO-based blackening layer is preferably a CuNO blackening layer, for example. This is because the etching rates for the Cu layer and the blackening layer can be made closer to each other.

In order to ensure a necessary electric conductivity, the Cu layer 22 has a thickness of, for example, 20 nm or more, preferably 40 nm or more, still more preferably 60 nm or more. However, when the Cu layer 22 has an excessively large thickness, etching thereof takes an excessively long time. Thus, the thickness is, for example, 2 μm or less, preferably 1 μm or less, more preferably 400 nm or less.

The material for the substrate 21 is not particularly limited as long as it is a non-conductive material. Examples of the material include polyethylene terephthalate resins (PET), aliphatic cyclic polyolefin resins (COP), glass, polycarbonate resins (PC), and acrylic resins (PMMA). When the electrical wiring member is used for a display device, the substrate 21 is desirably substantially transparent. The thickness of the substrate 21 is not particularly limited; however, the thickness is, for example, 15 μm to 200 μm, preferably 20 μm to 150 μm, more preferably 25 μm to 125 μm.

The methods for forming the Cu layer 22 and the CuNO-based blackening layer 23 are not particularly limited; such layers can be formed by, for example, a sputtering method, a vapor deposition method, or a CVD method, or can be formed by modifying the surface of a Cu layer. In this embodiment, a method for forming the layered film by a sputtering method will be described as an example.

Figure 24:
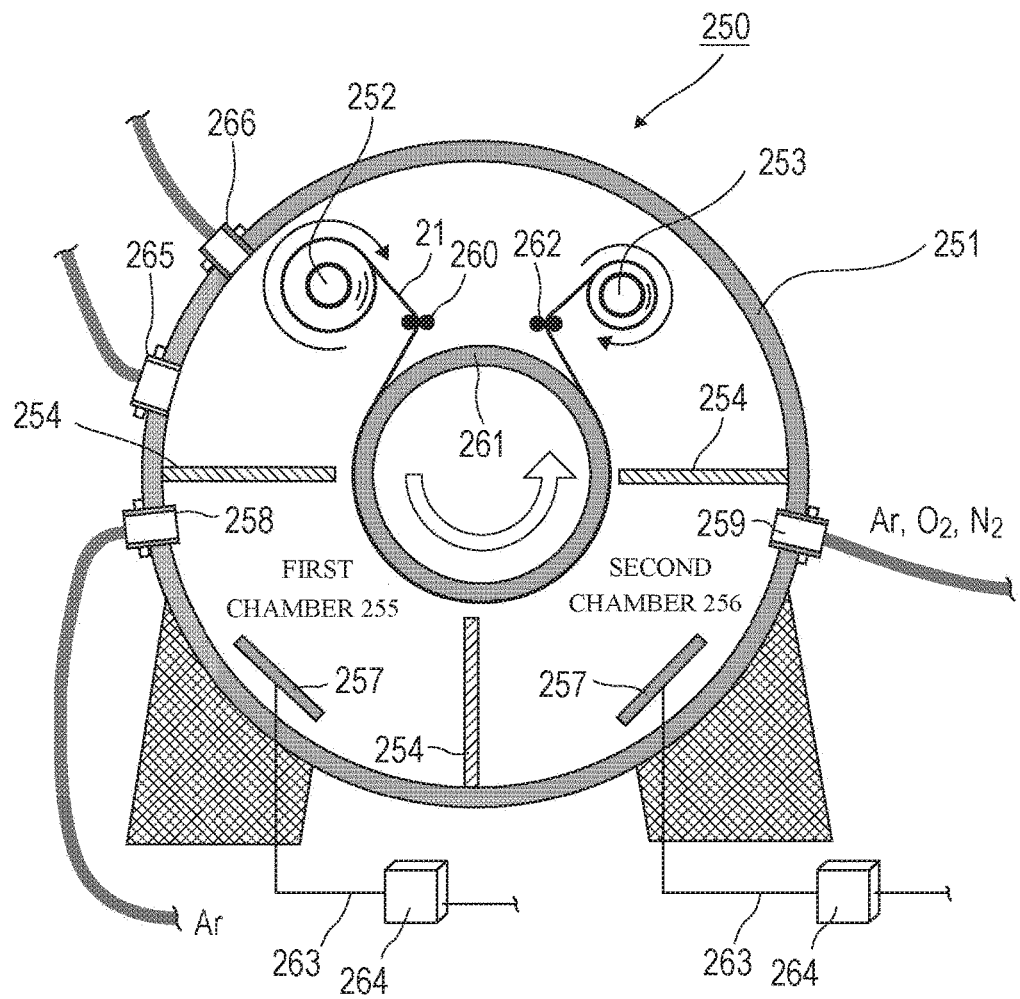
FIG. 24 is a sectional view (partially side view) of a sputtering apparatus applicable to a method for producing an electrical wiring member according to an embodiment of the present invention.

FIG. 24 is a sectional view of a sputtering apparatus 250 that is an apparatus for producing an electrical wiring member according to this embodiment. The sputtering apparatus 250 includes a sealed housing 251; a substrate unwinding reel 252 and a substrate winding reel 253 that are formed within the sealed housing 251; a first chamber 255 and a second chamber 256 adjacent to the first chamber 255 that are formed within the sealed housing 251 and defined by partitions 254. In the first chamber 255 and the second chamber 256, Cu target materials 257 are disposed. In addition, in the first chamber 255, an inlet 258 for argon gas that is made to impact on the Cu target material 257 is formed. In the second chamber 256, an inlet 259 for oxygen gas and/or nitrogen gas is formed, but argon gas can also be supplied. The inlet 259 may be used to introduce, in addition to argon gas, hydrogen gas ($H_2$) in order to promote incorporation of nitrogen into the blackening layer.

In addition, in the sealed housing 251, a low-vacuum suction port 65 and a high-vacuum suction port 266 are provided. The low-vacuum suction port 265 is connected to, for example, an oil rotary vacuum pump (not shown), so that the internal pressure of the sealed housing 251 can be rapidly reduced to an appropriate degree of vacuum. The high-vacuum suction port 266 is connected to, for example, a turbo-molecular pump (not shown), so that the internal pressure of the sealed housing 251 can be reduced to a high degree of vacuum at which sputtering can be performed.

In the substrate unwinding reel 252, the above-described substrate 21 is held in the form of a roll. The substrate 21 is sent from the substrate unwinding reel 252, via pinch rolls 260, an internal drum 261, pinch rolls 262, and is finally wound by the substrate winding reel 253.

The Cu target materials 257 disposed in the first chamber 255 and the second chamber 256 are connected via lead wires 263 to controllers 264, so that predetermined potentials are applied thereto. The sputtering method may be DC sputtering of applying a direct voltage between two electrodes, RF sputtering involving radio-frequency application, magnetron sputtering, or ion-beam sputtering.

On the substrate 21 that is unwound from the substrate unwinding reel 252 and enters the first chamber 255, a Cu layer is formed by sputtering with the Cu target material 257 (FIG. 22). Since only the inlet 258 for argon gas, which is an inert gas, is formed in the first chamber 255, oxygen and/or nitrogen is not basically incorporated into the Cu layer 22 (except for those inevitably incorporated).

Subsequently, on the substrate 21 that enters the second chamber 256, a Cu layer is formed by sputtering with the Cu target material 257. At this time, since oxygen gas and/or nitrogen gas is supplied through the inlet 259 into the second chamber 256, the layer formed on the Cu layer 22 is the CuNO-based blackening layer 23, which is a Cu layer with incorporated oxygen (O) and/or nitrogen (N) atoms (FIG. 23). In other words, the step of forming the CuNO-based blackening layer is preferably performed by Cu-sputtering in an atmosphere containing at least nitrogen gas and oxygen gas. The content ratio of nitrogen gas/oxygen gas is, for example, 21%/9% or 15%/12%.

Figure 25:
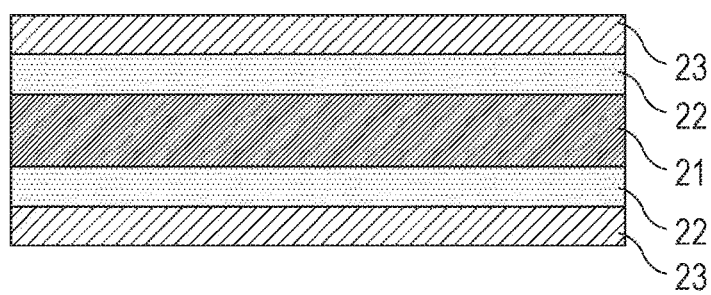
FIG. 25 is a step sectional view relating to a method for producing an electrical wiring member according to an embodiment of the present invention.

In the same manner as above, a Cu layer 22 and a CuNO-based blackening layer 23 can also be formed on the back surface side of the substrate 21. For example, the substrate roll having been wound around the substrate winding reel 253 after completion of the step in FIG. 23, is set to the substrate unwinding reel 252 such that the back surface side of the substrate 21 faces the Cu target materials 257. The substrate 21 is sent from the substrate unwinding reel 252, via the pinch rolls 260, the internal drum 261, and the pinch rolls 262, and finally set to the substrate winding reel 253. In this state, the sputtering apparatus 250 is operated, so that, as illustrated in FIG. 25, the Cu layer 22 and the CuNO-based blackening layer 23 can also be formed on the back surface side of the substrate 21.

From the viewpoint of effective use of a single production apparatus, as described above, the method of detaching a substrate roll from the substrate winding reel 253 and attaching it to the substrate unwinding reel 252 is preferably performed, for example. Alternatively, from the viewpoint of increasing the rate of producing the electrical wiring member, chambers configured to form films on the back surface side of the substrate 21 (for example, after the second chamber, a third chamber and a fourth chamber (not shown)) may be provided within the same sealed housing 251, or, in addition to the sputtering apparatus 250, another sputtering apparatus (not shown) configured to form films on the back surface side of the substrate 21 may be disposed.

In the above description, the inlet 259 for oxygen gas and/or nitrogen gas is formed in the second chamber 256. This is intended to form Cu layer 22/CuNO-based blackening layer 23 in this order as illustrated in FIG. 23.

Figure 26:
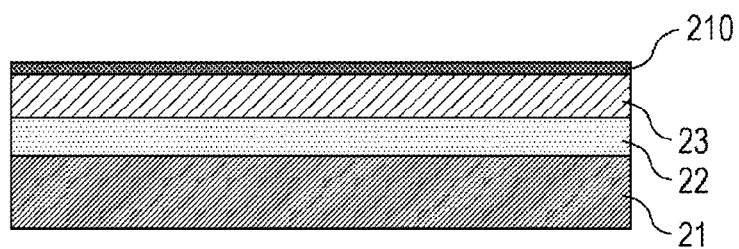
FIG. 26 is a step sectional view relating to a method for producing an electrical wiring member according to an embodiment of the present invention.

(2-2) Step of Forming Resist Layer in Predetermined Region on CuNO-based Blackening Layer FIG. 26 to FIG. 29 are step sectional views corresponding to portions of the method for producing an electrical wiring member according to this embodiment. As illustrated in FIG. 26, a resist layer 210 is first formed uniformly over the predetermined region on the CuNO-based blackening layer. The material for the resist layer 210 is also not particularly limited; the material may be in semisolid form (paste form) or in solid form (film form).

Figure 27:
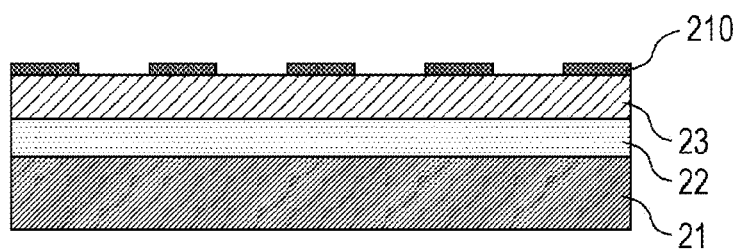
FIG. 27 is a step sectional view relating to a method for producing an electrical wiring member according to an embodiment of the present invention.

Subsequently, as illustrated in FIG. 27, for example, a lithography process is used to pattern the resist layer 210. The step of partially removing the resist layer is typically achieved by irradiating portions of the resist layer with light, and removing, with a developer, the portions irradiated with light (positive photoresist), or removing, with a developer, portions not irradiated with light (negative photoresist).

Figure 28:
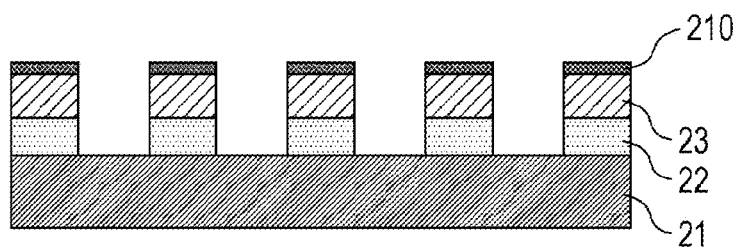
FIG. 28 is a step sectional view relating to a method for producing an electrical wiring member according to an embodiment of the present invention.

(2-3) Step of Removing Partial Regions of Cu Layer and CuNO-based Blackening Layer As illustrated in FIG. 28, the Cu layer 22 and the CuNO-based blackening layer 23 that are exposed without being covered by the resist layer 210 are brought into contact with an etchant, to thereby remove a portion of the Cu layer 22 and a partial region of the CuNO-based blackening layer 23. The etchant used is not particularly limited as long as it is capable of etching both of the Cu layer and the CuNO-based blackening layer. However, in order to appropriately ensure etching controllability, the etching rate needs to be controlled. In order to control the etching rate, for example, adjustments in terms of temperature, concentration, and pH are desirably performed. After the partial regions of the Cu layer 22 and the CuNO-based blackening layer 23 are removed, a cleaning solution is used to remove the remaining resist layer 210.

In the step of removing partial regions of the Cu layer 22 and the CuNO-based blackening layer 23, the Cu layer 22 and the CuNO-based blackening layer 23 are preferably formed into, for example, a mesh pattern, a striped pattern, a wave pattern constituted by wavy stripes, or a punching pattern including plural holes. In this case, the light transmittance of the electrical wiring member can be increased.

Figure 29:
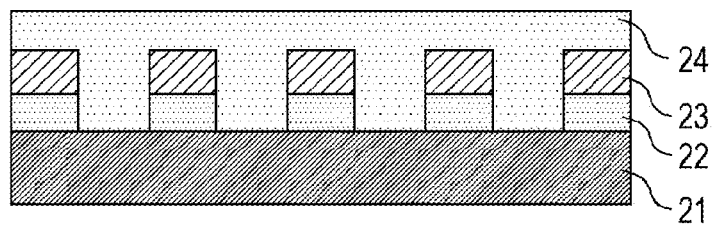
FIG. 29 is a step sectional view relating to a method for producing an electrical wiring member according to an embodiment of the present invention.

(2-4) Step of Forming Dielectric Layer on Substrate and on Patterned Layered Film As illustrated in FIG. 29, a dielectric layer 24 is formed on the exposed substrate 21 and on the patterned layered film. Specifically, in the electrical wiring member, the Cu layer 22, which faces the substrate, the CuNO-based blackening layer 23, and the dielectric layer 24 are stacked in this order. In order to suppress reflection of light by the Cu layer 22, the CuNO-based blackening layer 23 is formed on the Cu layer 22. In addition, the dielectric layer 24 that is effective to suppress reflection is further formed on the substrate 21 and on the patterned layered film, to thereby decrease the reflectivity of, as a whole, the Cu layer 22, the CuNO-based blackening layer 23, and the dielectric layer 24.

The material for the dielectric layer 24 is not particularly limited. Examples of the material include oxides such as SiO, $SiO_2$, $TiO_2$, $Al_2O_3$, $Ta_2O_5$, $Nb_2O_5$, $ZrO_2$, $HfO_2$, $La_2O_3$, $Cr_2O_3$, $CeO_2$, $Y_2O_3$, ZnO, and ITO; fluorides such as $CaF_2$ and $MgF_2$; and nitrides such as $Si_3N_4$. In particular, the dielectric layer 24 is preferably a $SiO_2$ layer. This is because $SiO_2$ is easy to produce and is also easy to handle due to its stable structure.

The dielectric layer 24 preferably has a thickness of 10 nm to 200 nm, more preferably 18 nm to 100 nm, still more preferably 36 nm to 70 nm. The total thickness of the CuNO-based blackening layer 23 and the dielectric layer 24 is preferably 100 nm or less, for example. This is because, when the total thickness of the CuNO-based blackening layer 23 and the dielectric layer 24 is more than 100 nm, it becomes difficult to press-bond together the CuNO-based blackening layer 23 and the dielectric layer 24, so that an electrical connection to the Cu layer 22 is less likely to be established.

The method for forming the dielectric layer 24 on the substrate 21 and on the patterned layered film may involve, as with the method for forming the Cu layer 22 and the CuNO-based blackening layer 23 on the substrate 21, formation by, for example, a sputtering method, a vapor deposition method, or a CVD method. For example, within a chamber of a sputtering apparatus in a vacuum state, sputtering is performed with a Si target material under introduction of oxygen gas, to thereby form a $SiO_2$ layer as the dielectric layer 24 on the substrate 21 and on the CuNO-based blackening layer 23.

Electrical wiring members according to embodiments other than the electrical wiring member in FIG. 29 will be described with reference to FIG. 30 to FIG. 33. Incidentally, in the descriptions of FIG. 30 to FIG. 33, some descriptions overlapping the above descriptions will be omitted. FIG. 30 to FIG. 33 are sectional views of electrical wiring members according to embodiments of the present invention.

Figure 30:
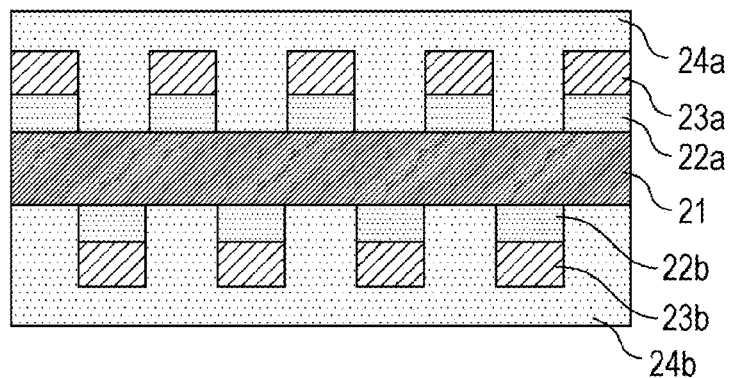
FIG. 30 is a sectional view of another electrical wiring member according to an embodiment of the present invention.

In the electrical wiring member illustrated in FIG. 30, on one main surface of a substrate 21, a Cu layer 22a and a CuNO-based blackening layer 23a are sequentially formed; this layered film is patterned; and, on the substrate 21 and on the patterned layered film, a dielectric layer 24a is formed.

In addition, on the other main surface of the substrate 21, a Cu layer 22*b* and a CuNO-based blackening layer 23*b* are sequentially formed; this layered film is patterned; and, on the substrate 21 and on the patterned layered film, a dielectric layer 24*b* is formed. Incidentally, the CuNO-based blackening layer 23*a* and 23*b* each have an extinction coefficient of 1.0 or more and 1.8 or less in the wavelengths of 400 nm to 700 nm. In the electrical wiring member in FIG. 30, since the CuNO-based blackening layer 23*a* and the dielectric layer 24*a* are formed on the Cu layer 22*a*, which is formed on the one main surface of the substrate 21, a reflectivity of 5% or less can be achieved upon entry of visible radiation into the dielectric layer 24*a* in FIG. 30. In addition, since the CuNO-based blackening layer 23*b* and the dielectric layer 24*b* are formed also on the Cu layer 22*b*, which is formed on the other main surface of the substrate 21, a reflectivity of 5% or less can also be achieved upon entry of visible radiation into the dielectric layer 24*b* in FIG. 30. In summary, in the electrical wiring member having the configuration in FIG. 30, a reflectivity of 5% or less upon entry of visible radiation can be achieved on both surfaces of the electrical wiring member.

Figure 31:
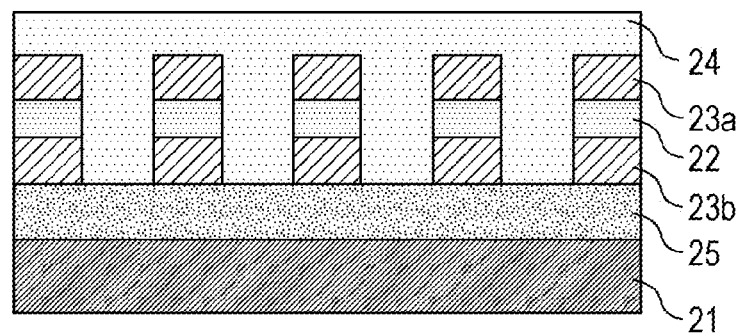
FIG. 31 is a sectional view of another electrical wiring member according to an embodiment of the present invention.

The electrical wiring member in FIG. 31 is an example in which a dielectric layer 25 and a CuNO-based blackening layer 23*b* are further formed between the substrate 21 and the Cu layer 22 of the electrical wiring member in FIG. 29. In this electrical wiring member, on one main surface of a substrate 21, a dielectric layer 25, a CuNO-based blackening layer 23*b*, a Cu layer 22, and a CuNO-based blackening layer 23*a* are sequentially formed; and a dielectric layer 24 is formed on the dielectric layer 25 and on the patterned layered film of the CuNO-based blackening layer 23*b*, the Cu layer 22, and the CuNO-based blackening layer 23*a*. Thus, in the electrical wiring member in FIG. 31, since the CuNO-based blackening layer 23*a* and the dielectric layer 24 are formed over the Cu layer 22, a low reflectivity can be achieved upon entry of visible radiation on the one main surface side of the substrate 21 (dielectric layer 24 side in FIG. 31). In addition, in the electrical wiring member, since the CuNO-based blackening layer 23*b* and the dielectric layer 25 are also formed under the Cu layer 22, a low reflectivity can also be achieved upon entry of visible radiation on the other main surface side of the substrate 21 (substrate 21 side in FIG. 31). When such an electrical wiring member is produced, the material for the dielectric layer 24 is not particularly limited; however, in order to achieve a reflectivity of 5% or less upon entry of visible radiation on the one main surface side of the substrate 21, preferred materials are $SiO_2$ and $Al_2O_3$, which have low refractive indexes. In contrast, examples of the material for the dielectric layer 25 include materials having high refractive indexes, such as $TiO_2$, $Ta_2O_5$, $Nb_2O_5$, $ZrO_2$, $HfO_2$, $La_2O_3$, $Cr_2O_3$, $CeO_2$, $Y_2O_3$, ZnO, ITO, SiO, and $Si_3N_4$, in order to achieve a low reflectivity upon entry of visible radiation on the other main surface side of the substrate 21. In particular, a material having a higher refractive index such as $TiO_2$ is preferably employed in order to achieve a reflectivity of 5% or less upon entry of visible radiation on the other main surface side of the substrate 21.

Figure 32:
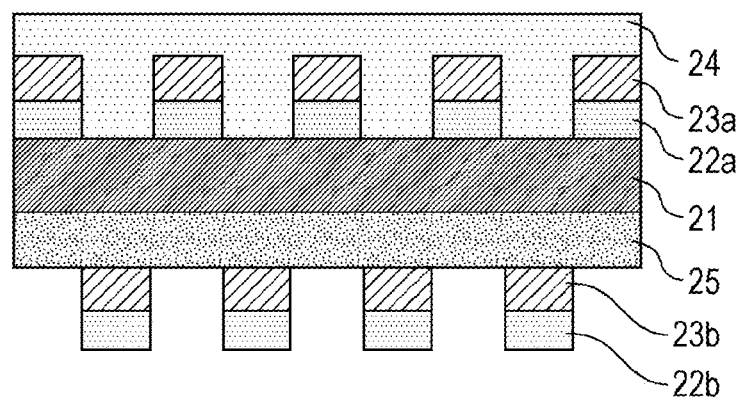
FIG. 32 is a sectional view of another electrical wiring member according to an embodiment of the present invention.

The electrical wiring member in FIG. 32 is an example in which, on the other main surface of the substrate 21 of the electrical wiring member in FIG. 29, a dielectric layer 25, a CuNO-based blackening layer 23*b*, and a Cu layer 22*b* are sequentially formed, and the CuNO-based blackening layer 23*b* and the Cu layer 22*b* are patterned. In the electrical wiring member in FIG. 32, as with the electrical wiring member in FIG. 29, since a CuNO-based blackening layer 23*a* and a dielectric layer 24 are formed over a Cu layer 22*a* on one main surface of the substrate 21, a low reflectivity at the upper surface of the Cu layer 22*a* can be achieved upon entry of visible radiation on the one main surface side of the substrate 21 (dielectric layer 24 side in FIG. 32). In addition, in this electrical wiring member, since the dielectric layer 25 and the CuNO-based blackening layer 23*b* are formed on the other main surface of the substrate 21, a low reflectivity at the upper surface of the Cu layer 22*b* can also be achieved upon entry of visible radiation on the one main surface side of the substrate 21 (dielectric layer 24 side in FIG. 32). Such an electrical wiring member is suitable when a Cu layer is disposed on both of the main surfaces of a substrate, and, upon entry of visible radiation on the one main surface side of the substrate 21, a low reflectivity at such Cu layers is intended to be achieved. Incidentally, as in the dielectric layer 24 of the electrical wiring member in FIG. 31, the material for the dielectric layer 24 is not particularly limited; however, preferred materials are $SiO_2$ and $Al_2O_3$, which have low refractive indexes. In contrast, examples of the material for the dielectric layer 25 include, as in the dielectric layer 25 of the electrical wiring member in FIG. 31, materials having high refractive indexes, such as $TiO_2$, $Ta_2O_5$, $Nb_2O_5$, $ZrO_2$, $HfO_2$, $La_2O_3$, $Cr_2O_3$, $CeO_2$, $Y_2O_3$, ZnO, ITO, SiO, and $Si_3N_4$. In particular, a material having a higher refractive index such as $TiO_2$ is preferably employed.

Figure 33:
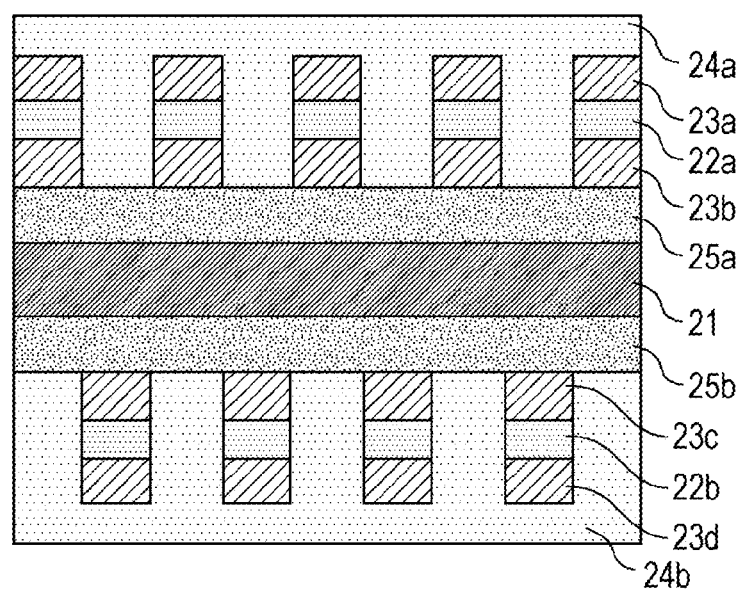
FIG. 33 is a sectional view of another electrical wiring member according to an embodiment of the present invention.

The electrical wiring member in FIG. 33 is an example in which the structure formed on one main surface of the substrate 21 of the electrical wiring member in FIG. 31, is similarly formed on the other main surface of the substrate 21. In the electrical wiring member in FIG. 33, on one main surface of the substrate 21, a dielectric layer 25*a*, a CuNO-based blackening layer 23*b*, a Cu layer 22*a*, and a CuNO-based blackening layer 23*a* are sequentially formed; and, on the dielectric layer 25*a* and on the patterned layered film of the CuNO-based blackening layer 23*b*, the Cu layer 22*a*, and the CuNO-based blackening layer 23*a*, a dielectric layer 24*a* is formed. In addition, on the other main surface of the substrate 21, a dielectric layer 25*b*, a CuNO-based blackening layer 23*c*, a Cu layer 22*b*, and a CuNO-based blackening layer 23*d* are sequentially formed; and, on the dielectric layer 25*b* and on the patterned layered film of the CuNO-based blackening layer 23*c*, the Cu layer 22*b*, and the CuNO-based blackening layer 23*d*, a dielectric layer 24*b* is formed. Thus, a low reflectivity at the upper surface of the Cu layer 22*a* and at the upper surface of the Cu layer 22*b* can be achieved upon entry of visible radiation on the one main surface side of the substrate 21 (dielectric layer 24*a* side in FIG. 33). In addition, a low reflectivity at the lower surface of the Cu layer 22*a* and at the lower surface of the Cu layer 22*b*can be achieved upon entry of visible radiation on the other main surface side of the substrate 21 (dielectric layer 24*b* side in FIG. 33). Such an electrical wiring member is suitable when a Cu layer is formed on both of the main surfaces of a substrate, and a low reflectivity upon entry of visible radiation on both main surface sides of the substrate is intended to be achieved. Incidentally, the material for the dielectric layers 24*a* and 24*b* is not particularly limited as in the dielectric layer 24 of the electrical wiring member in FIG. 31; however, preferred materials are $SiO_2$ and $Al_2O_3$, which have low refractive indexes. In contrast, examples of the material for the dielectric layer 5 include, as in the dielectric layer 5 of the electrical wiring member in FIG. 31, materials having high refractive indexes, such as $TiO_2$, $Ta_2O_5$, $Nb_2O_5$, $ZrO_2$, $HfO_2$, $La_2O_3$, $Cr_2O_3$, $CeO_2$, $Y_2O_3$, ZnO, ITO, SiO, and $Si_3N_4$. In particular, a material having a higher refractive index such as $TiO_2$ is preferably employed.

EXAMPLES

Hereinafter, the present invention will be described more specifically with reference to Examples. However, the present invention is not limited by the following Examples. Appropriate modifications can be obviously made on Examples as long as they fit the spirit and scope described above and below. Such modifications are all encompassed in the technical scope of the present invention.

1. Regarding Etching Control

In order to determine etching rates for CuNO-based blackening layers, a test was performed in which CuNO-based blackening layers having various compositions were prepared and immersed in etchants for a predetermined time, and the time taken for dissolution of the CuNO-based blackening layers was measured.

[Preparation of Samples]

Samples were each prepared by forming, on a PET substrate having a thickness of 50 μm and an area of 20 mm×70 mm, a CuNO-based blackening layer (a CuO blackening layer, a CuN blackening layer, or a CuNO blackening layer) having a thickness of 70 nm by sputtering. In addition, for comparison, samples in which a NiCu blackening layer was formed instead of such a CuNO-based blackening layer were prepared. A sputtering condition during formation of such a blackening layer was as follows.

Applied power: 9 kW (9.4 W/cm²)

columns of "Composition of blackening layer (at %)" describe the content ratios of elements in at % determined with an X-ray photoelectron spectrometer (XPS). On the right adjacent to these columns, the x column of the "CuNxOy representation" columns describes values each calculated by dividing the content ratio of nitrogen atoms (at %) by the content ratio of copper atoms (Cu) (at %). The y column of the "CuNxOy representation" columns describes values each calculated by dividing the content ratio of oxygen atoms (at %) by the content ratio of copper atoms (Cu) (at %). Incidentally, Sample Nos. 2 and 3 were not subjected to the XPS measurement because the blackening layers were obviously represented by the chemical formula CuO on the basis of the gas species used in the formation of the blackening layers.

[Maximum Reflectivity Measurement Test]

In Table 1, "Maximum reflectivity (%)", which denotes an optical reflectivity of a blackening layer, was specifically determined in the following manner. In each of samples prior to etching of the blackening layer, the blackening layer was irradiated with visible radiation perpendicularly thereto; and the maximum optical reflectivity (%) determined during scanning with the visible radiation over the wavelengths of 400 nm to 700 nm was defined as the "Maximum reflectivity (%)". The instrument used for measuring the reflectivity was a spectrophotometer (product number: CM-3500d; manufactured by KONICA MINOLTA JAPAN, INC.). Incidentally, the samples used for measuring the maximum reflectivity were different, from the samples prepared in the above-described etching test, only in that a Cu layer was sandwiched between the PET substrate and the blackening layer.

TABLE 1

| Sample No. | Chemical formula of blackening layer | Amounts of gases introduced $N_2$ (%) | $O_2$ (%) | Composition of blackening layer (determined with XPS) N (at %) | O (at %) | Cu (at %) | CuNxOy representation x | y | Maximum reflectivity (%) | Etching time (relative to Cu) Sulfuric acid-hydrogen peroxide-based | Iron chloride-based | Copper chloride-based |
|---|---|---|---|---|---|---|---|---|---|---|---|---|
| 1 | Cu | 0 | 0 | — | — | — | | | 89 | 1.0 | 1.0 | 1.0 |
| 2 | CuO | 0 | 50 | — | — | — | | | 68 | 3.7 | 6.8 | 10.0 |
| 3 | CuO | 0 | 40 | — | — | — | | | 60 | 4.4 | 8.5 | 10.0 |
| 4 | CuNO | 25 | 25 | 0.0 | 28.0 | 72.0 | 0.00 | 0.39 | 49 | 0.3 | 0.2 | 1.5 |
| 5 | CuNO | 30 | 20 | 0.6 | 25.2 | 74.2 | 0.01 | 0.34 | 31 | 0.3 | 0.3 | 1.3 |
| 6 | CuNO | 35 | 15 | 2.0 | 17.7 | 80.3 | 0.02 | 0.22 | 26 | 0.4 | 0.3 | 1.2 |
| 7 | CuNO | 25 | 15 | 2.1 | 15.1 | 82.8 | 0.03 | 0.18 | 27 | 0.4 | 0.4 | 1.1 |
| 8 | CuNO | 20 | 15 | 2.0 | 15.1 | 82.9 | 0.02 | 0.18 | 27 | 0.2 | 0.5 | 0.8 |
| 9 | CuNO | 45 | 15 | 2.1 | 14.6 | 83.3 | 0.03 | 0.18 | 25 | 0.4 | 0.3 | 1.0 |
| 10 | CuNO | 40 | 10 | 4.3 | 9.0 | 86.7 | 0.05 | 0.10 | 25 | 1.3 | 0.5 | 2.9 |
| 11 | CuNO | 20 | 12 | 2.7 | 9.4 | 87.8 | 0.03 | 0.11 | 27 | 0.4 | 0.5 | 1.0 |
| 12 | CuNO | 15 | 12 | 1.3 | 9.8 | 89.0 | 0.01 | 0.11 | 28 | 0.3 | 0.4 | 0.5 |
| 13 | CuNO | 45 | 5 | 4.6 | 4.1 | 91.3 | 0.05 | 0.04 | 24 | 2.7 | 0.5 | 6.6 |
| 14 | CuN | 50 | 0 | 3.1 | 0.6 | 96.3 | | | 37 | 1.9 | 0.5 | 6.9 |
| 15 | Ni0.65 Cu0.35 | | | | | | | | 21 | 10 or more | 10 or more | 10 or more |
| 16 | Ni0.40 Cu0.60 | | | | | | | | 20 | 10 or more | 10 or more | 10 or more |

[Etching Test]

The samples were immersed in liquid etchants at room temperature contained in beakers, and the time taken for dissolution of the blackening layers formed by sputtering was determined. The measurement results are described in Table 1 below. In Table 1, for each of the samples, the time taken for the etching is described relative to the time that was taken for etching Cu and defined as 1. In Table 1, the

[XPS Analysis of Blackening Layers]

The prepared samples (Sample Nos. 4 to 13) were analyzed in terms of composition with an X-ray photoelectron spectrometer (XPS). The specifications of the XPS spectrometer are as follows.

[Specifications of system]

Name of product: Quantum 2000 manufactured by ULVAC-PHI, Inc. X-ray source: mono-AlKa (hv: 1486.6 ev)

Depth of detection: several nanometers to several tens of nanometers Acceptance angle: About 45°

Analysis region: Spot having diameter of about 200 μm
[Sputtering Conditions for Analysis]
Ion species: $Ar^+$
Acceleration voltage: 1 kV
Scanning area: 2×2 mm
Sputtering rate: 1.5 nm/min (value in terms of $SiO_2$)

Figure 19:
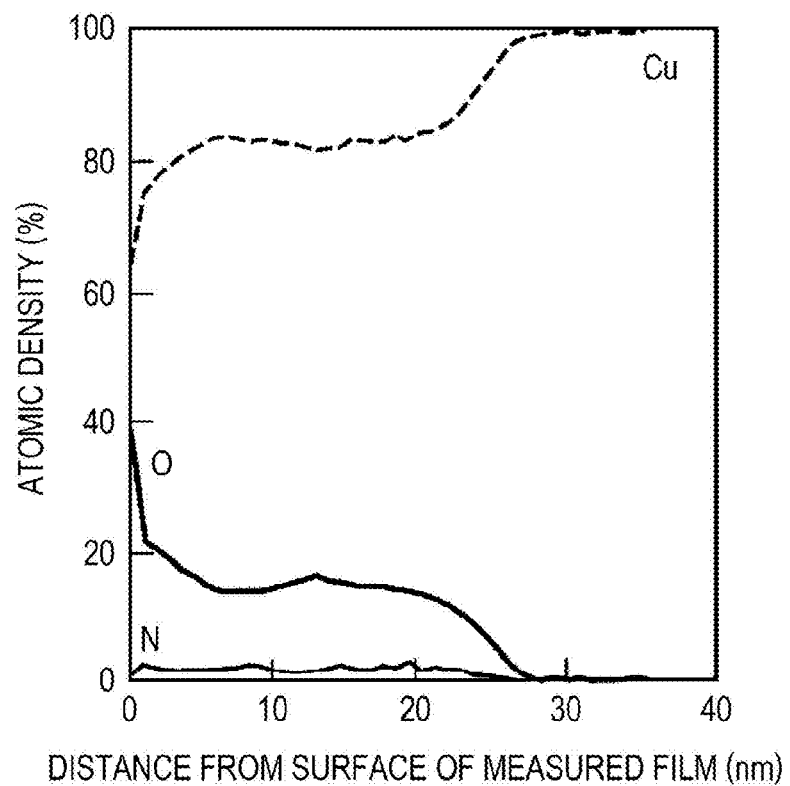
FIG. 19 illustrates a relationship between depth in a film, from its surface, measured by XPS analysis and measured atomic density (%).

FIG. 19 illustrates an example of a relationship between depth in a film, from its surface, measured by XPS analysis, and measured atomic density (%). As illustrated in FIG. 19, the surface of the measured film is oxygen-rich due to oxidation of the surface. Where the depth from the surface of the measured film is 20 nm or more, an increase in the Cu content ratio due to the underlying layer is observed. For this reason, in order to determine the composition of the blackening layer itself as accurate as possible, in the present invention, the composition ratio of the blackening layer was determined by averaging composition ratios at five arbitrary points within a depth range of 7 nm to 13 nm from the surface of the measured film.

As is understood from Table 1, in the samples employing not a CuNO-based blackening layer but a NiCu blackening layer, the etching time is 10 or more; in contrast, in the cases of employing a CuNO-based blackening layer, the etching time is shorter, that is, closer to the etching time for Cu.

As is understood from Table 1, in the cases of employing a CuO blackening layer, there is a tendency of an increase in the etching time and there is also a tendency of an increase in the maximum reflectivity. Thus, as the material for a blackening layer, CuNO and CuN are probably better than CuO.

In addition, Table 1 indicates that, among the CuNO blackening layers, CuNO blackening layers (Sample Nos. 5 to 13) that satisfy 0.01≤x≤0.05 and 0.01≤y≤0.35 achieve a low maximum reflectivity of less than 40%.

Figure 20:
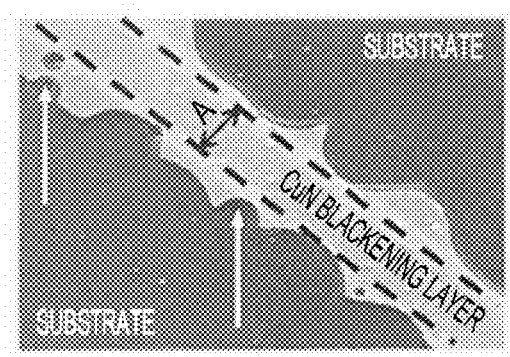
FIG. 20 is a SEM photograph of a sample used in EXAMPLES, the photograph being taken from the CuN blackening layer side after etching treatment.

FIG. 20 is a SEM photograph of a sample (Sample No. 14) after etching treatment, the photograph being taken from the CuN blackening layer side. In FIG. 20, "A" represented by the black double-headed arrow indicates the width of a photoresist layer (refer to "4a" in FIG. 9) and corresponds to the region where the photoresist layer had been linearly formed. However, the edge portions of the CuN blackening layer do not constitute a linear etching pattern, and have marks represented by white arrows and indicating as if etching proceeded from points; thus, the CuN blackening layer has a meandering pattern. In summary, when CuN is employed as the material for the blackening layer, it is difficult to control the line width of the Cu layer. In addition, the width of the CuN blackening layer and the Cu layer becomes larger than the target value (the width represented by A) and, as a result, the layers become more noticeable, which is problematic.

Figure 21:
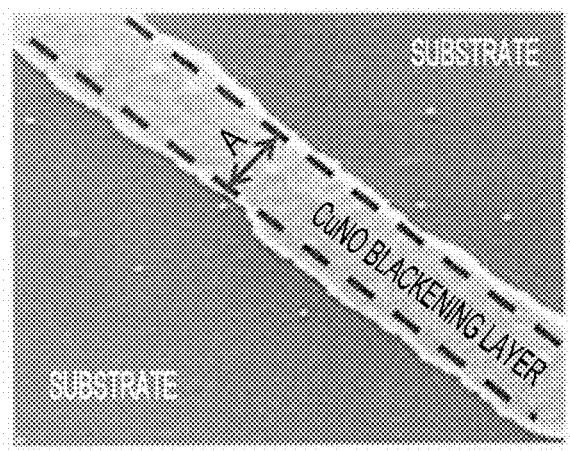
FIG. 21 is a SEM photograph of a sample used in EXAMPLES, the photograph being taken from the CuNO blackening layer side after etching treatment.

In contrast, FIG. 21 relates to an example in which the material for the blackening layer is CuNO, and is a SEM photograph of a sample (Sample No. 6) after etching treatment, the photograph being taken from the CuNO blackening layer side. In FIG. 21, "A" represented by the black double-headed arrow indicates the width of a photoresist layer as in FIG. 20. As is understood from FIG. 21, the edge portions of the CuNO blackening layer constitute a linear etching pattern and the intended etching pattern is obtained. Thus, from the viewpoint of the etching controllability of the edge portions of a blackening layer, a CuNO blackening layer is probably better than a CuN blackening layer.

In summary, in the present invention, as the material for a blackening layer, a CuNO-based blackening layer is employed to thereby address the problem of an increase in the electric resistance due to excessive narrowing of the Cu layer, or exposure of the Cu layer due to excessive narrowing of the blackening layer, and an increase in the amount of light reflected by the Cu layer. Therefore, the present invention is highly advantageous in terms of industrial applicability.

2. Regarding Greater Suppression of Reflectivity
[Method of Test]

A test was performed in which various electrical wiring members (samples) including a substrate and a layered film were prepared, and determined in terms of (A) an extinction coefficient in wavelengths of 400 nm to 700 nm, (B) reflectivity in wavelengths of 400 nm to 700 nm, and (C) etching controllability of a blackening layer and a Cu layer.
[Preparation of Samples]

On a PET substrate having a thickness of 50 μm and an area of 20 mm×70 mm, a Cu layer having a thickness of 100 nm was formed by sputtering; and subsequently, a blackening layer (a CuNO blackening layer, a CuO blackening layer, a CuN blackening layer, or a NiCu blackening layer) was formed thereon. Subsequently, the sample was immersed in a liquid etchant at room temperature contained in a beaker, to thereby etch the blackening layer formed by sputtering. On the etched Cu layer and blackening layer, a dielectric layer (a $SiO_2$ layer, or a $SiO_2$ layer and a $TiO_2$ layer) was formed. Incidentally, in some samples, such a blackening layer and/or a dielectric layer was not formed. The samples used were the following nine samples, Sample 1: $SiO_2$/CuNO/Cu, Sample 2: CuNO/Cu, Sample 3: $SiO_2$/CuO/Cu, Sample 4: Cu, Sample 5: CuO/Cu, Sample 6: CuN/Cu, Sample 7: $SiO_2$/$TiO_2$/Cu, Sample 8: $SiO_2$/$TiO_2$/$SiO_2$/$TiO_2$/$SiO_2$/$TiO_2$/$SiO_2$/$TiO_2$/Cu, and Sample 9: NiCu/Cu. Incidentally, a sputtering condition during formation of such a blackening layer was as follows.

Applied power: 9 kW (9.4 W/cm$^2$)
(A) Test of Measuring Extinction Coefficient

In Table 2, "Extinction coefficient", which denotes the extinction coefficient of a blackening layer in the wavelengths of 400 nm to 700 nm, was specifically determined in the following manner. The extinction coefficient is determined from layer thickness d (nm) determined through observation of a section of the CuNO-based blackening layer, and single-surface reflectivity $R_0$ (%) and transmittance T (%) that are determined by spectrometry. The extinction coefficient is calculated by the following procedures (A-1) to (A-4). In this test, it was examined whether extinction coefficient k in the wavelengths of 400 nm to 700 nm was 1.0 or more.
(A-1) Preparation of Measurement Sample On a polyolefin copolymer film substrate having a thickness of 200 μm, a CuNO-based blackening layer having a thickness of 40 nm to 100 nm is formed to provide a sample for measuring extinction coefficient k (hereafter, sometimes simply referred to as "sample").
(A-2) Measurement of Thickness of CuNO-based Blackening Layer The thickness d of the CuNO-based blackening layer is determined through observation of a section of the CuNO-based blackening layer with a focused ion beam system (product number: FB2200; manufactured by Hitachi High-Technologies Corporation) and an ultra-high resolution scanning electron microscope (product number: SU8010; manufactured by Hitachi High-Technologies Corporation).

(A-3) Measurement of Single-surface Reflectivity and Transmittance of Sample

The single-surface reflectivity $R_0$ (%) and transmittance T (%) of the sample in the wavelengths of 400 nm to 700 nm are measured with a spectrophotometer (product number: U-4100; manufactured by Hitachi High-Technologies Corporation). FIG. 34 and FIG. 35 are conceptual views illustrating the method of measuring the single-surface reflectivity $R_0$ and transmittance T of a sample according to the present invention. As illustrated in FIG. 34, entry of incoming light 220 (visible radiation) into the CuNO-based blackening layer 23 of the sample constituted by the substrate 21 and the CuNO-based blackening layer 23, causes generation of reflected light 221 at the front surface of the CuNO-based blackening layer 23, reflected light 222 at the interface between the substrate 21 and the CuNO-based blackening layer 23, and reflected light 223 at the back surface of the substrate. Outgoing light 224 is outgoing light derived from the incoming light having been transmitted by the CuNO-based blackening layer 23. Outgoing light 225 is outgoing light derived from the incoming light 220 having been transmitted by the CuNO-based blackening layer 23 and the substrate 21.

The single-surface reflectivity $R_0$ of the sample is the sum of the reflectivity in terms of the reflected light 221 and the reflectivity in terms of the reflected light 222. As illustrated in FIG. 35, in the measurement of single-surface reflectivity $R_0$, the back surface of the substrate 21 is matted and painted black to form an anti-reflection layer 226, to thereby eliminate the reflected light 223 at the back surface of the substrate. The transmittance T of the sample is the ratio of the intensity of the outgoing light 225 to the intensity of the incoming light 220.

(A-4) Calculation of Extinction Coefficient

The extinction coefficient k is calculated by Mathematical formulae 1 and 2 below. $T_i$ denotes the internal transmittance of the CuNO-based blackening layer 23, and is represented by Mathematical formula 2 below. $R_{0f}$ denotes the single-surface reflectivity (%) of the CuNO-based blackening layer 23, and is represented by $R_{0f}=R_0/2$. As illustrated in FIG. 34, the single-surface reflectivity $R_{0f}$ of the CuNO-based blackening layer 23 is a reflectivity in terms of the reflected light 221 at the front surface of the CuNO-based blackening layer 23. $T_f$ denotes the transmittance (%) of the CuNO-based blackening layer 23, and is represented by $T_f=T$. As illustrated in FIG. 35, the transmittance $T_f$ of the CuNO-based blackening layer 23 is the ratio of the intensity of the outgoing light 224 to the intensity of the incoming light 220.

$$k = -\frac{\lambda \ln T_i}{4\pi d} \qquad [\text{Math. 1}]$$

$$T_i = -(1-R_{0f})^2 + \sqrt{\frac{(1-R_{0f})^4 + 4R_{0f}^2 T_f^2}{2 T_f R_{0f}^2}} \qquad [\text{Math. 2}]$$

Incidentally, when an electrode or a protective layer is formed on the substrate, or the composition of the blackening layer is unknown, in "Preparation method of measurement sample" in (A-1) above, the blackening layer is formed in terms of thickness and composition so as to satisfy the same conditions of the thickness and composition ratio determined by the method described in (A-5) below. In this case, the procedure (A-2) is omitted.

(A-5) Measurement of Thickness and XPS Analysis of Blackening Layer of Unknown Sample The thickness $d_u$ of the blackening layer of an unknown sample is measured through observation of a section of the unknown sample. The thickness $d_u$ of the unknown sample is measured with a focused ion beam system (product number: FB2200; manufactured by Hitachi High-Technologies Corporation) and an ultra-high resolution scanning electron microscope (product number: SU8010; manufactured by Hitachi High-Technologies Corporation).

The blackening layer of the unknown sample is analyzed in terms of composition with an X-ray photoelectron spectrometer (XPS), to determine the composition ratio of the blackening layer of the unknown sample. The composition ratio of the blackening layer of the unknown sample is determined as the average value of composition ratios at five arbitrary points. The specifications of the XPS spectrometer are as follows.

[Specifications of system]

Name of product: Quantum 2000 manufactured by ULVAC-PHI, Inc.

X-ray source: mono-AlKa (hv: 1486.6 ev)

Depth of detection: several nanometers to several tens of nanometers Acceptance angle: About 45°

Analysis region: Spot having diameter of about 200 μm

[Sputtering conditions for analysis]

Ion species: $Ar^+$

Acceleration voltage: 1 kV

Scanning area: 2×2 mm

Sputtering rate: 1.5 nm/min (value in terms of $SiO_2$)

(B) Reflectivity Measurement Test

In Table 2, "Reflectivity" denotes a reflectivity determined when each sample, on its blackening layer side, is irradiated with visible radiation perpendicularly thereto to perform scanning with the visible radiation over the wavelengths of 400 nm to 700 nm. The instrument used for measuring the reflectivity is a spectrophotometer (product number: CM-3500d; manufactured by KONICA MINOLTA JAPAN, INC.). In this test, it was examined whether the reflectivity in the wavelengths of 400 nm to 700 nm was 5% or less.

(C) Etching Controllability Measurement Test

In Table 2, "Etching controllability" was determined through observation of the etching pattern of the CuNO-based blackening layer and Cu layer (or only the Cu layer) of each sample from the blackening layer side of the sample with an optical microscope or a SEM. In this test, when the edge portions of the blackening layer and Cu layer (or only the Cu layer) have an etching pattern that is linear, the etching controllability is evaluated as good; or when the etching pattern is a meandering pattern, the etching controllability is evaluated as poor.

Figure 37:
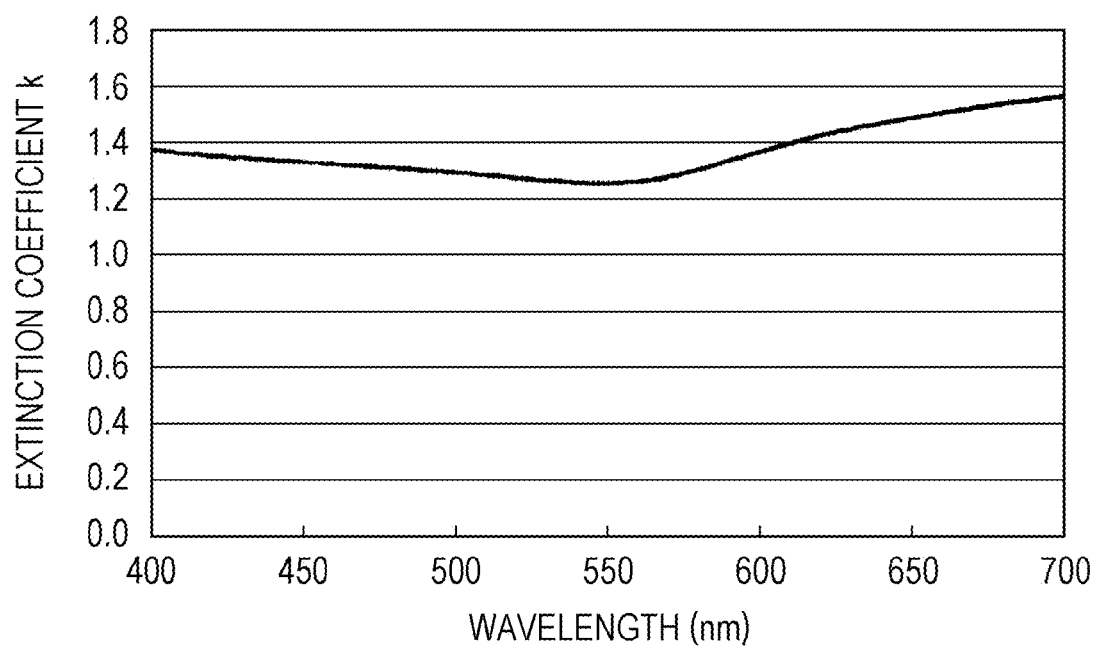
FIG. 37 is a graph of an extinction coefficient in the wavelengths of 400 nm to 700 nm in Comparative Example 1 according to the present invention.
Figure 38:
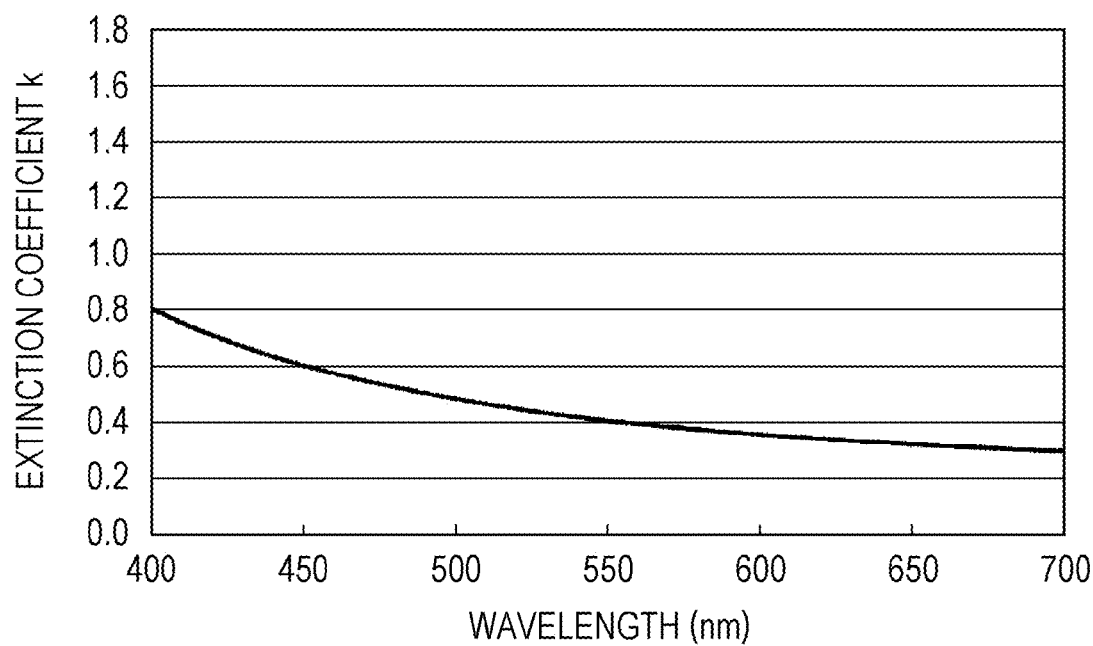
FIG. 38 is a graph of an extinction coefficient in the wavelengths of 400 nm to 700 nm in Comparative Example 2 according to the present invention.

Table 2 describes the following test conditions and results of the test: Sample No.; materials for the dielectric layer, the blackening layer, and the Cu layer; the thickness (nm) of the dielectric layer, the blackening layer, and the Cu layer; the amounts (%) of $N_2$ gas and $O_2$ gas introduced during formation of the blackening layer; an extinction coefficient; a reflectivity (%); and an etching pattern. FIG. 36 to FIG. 38 are graphs of an extinction coefficient in the wavelengths of 400 nm to 700 nm in Example 1 to Comparative Example 2. FIG. 39 to FIG. 47 are graphs of reflectivity in the wavelengths of 400 nm to 700 nm in Example 1 to Comparative Example 8.

TABLE 2

| | Sample No. | Materials | | | Thickness (nm) | | | Amounts of gases introduced during formation of blackening layer | | Extinction coefficient | Reflectivity (%) | Etching controlla-aility |
| | | Dielectric layer | Blackening layer | Cu layer | Dielectric layer | Blackening layer | Cu layer | $N_2$ (%) | $O_2$ (%) | | | |
|---|---|---|---|---|---|---|---|---|---|---|---|---|
| Example 1 | Sample 1 | $SiO_2$ | CuNO | Cu | 66.8 | 40.1 | 100 | 21 | 9 | 1.17-1.38 | 0.4-4.8 | Linear |
| Comparative Example 1 | Sample 2 | — | CuNO | Cu | — | 40 | 100 | 15 | 12 | 1.26-1.57 | 15.0-28.7 | Linear |
| Comparative Example 2 | Sample 3 | $SiO_2$ | CuO | Cu | 10 | 39.9 | 100 | 0 | 50 | 0.31-0.81 | 8.0-16.1 | Meandering |
| Comparative Example 3 | Sample 4 | — | — | Cu | — | — | 100 | — | — | — | 38.1-87.2 | Linear |
| Comparative Example 4 | Sample 5 | — | CuO | Cu | — | 30 | 100 | 0 | 50 | 0.31-0.81 | 3.3-17.3 | Meandering |
| Comparative Example 5 | Sample 6 | — | CuN | Cu | — | 30 | 100 | 50 | 0 | — | 9.0-18.3 | Meandering |
| Comparative Example 6 | Sample 7 | $SiO_2$, $TiO_2$ | — | Cu | ($SiO_2$) 170.5 ($TiO_2$) 29.5 | — | 100 | — | — | 0 | 11.5-89.1 | Linear |
| Comparative Example 7 | Sample 8 | $SiO_2$ (4 layers), $TiO_2$ (4 layers) | — | Cu | ($SiO_2$) 371.2 ($TiO_2$) 163.4 | — | 100 | — | — | 0 | 0.6-96.5 | Linear |
| Comparative Example 8 | Sample 9 | — | NiCu | Cu | — | 35 | 100 | — | — | — | 12.3-20.6 | Meandering |

Example 1

Figure 39:
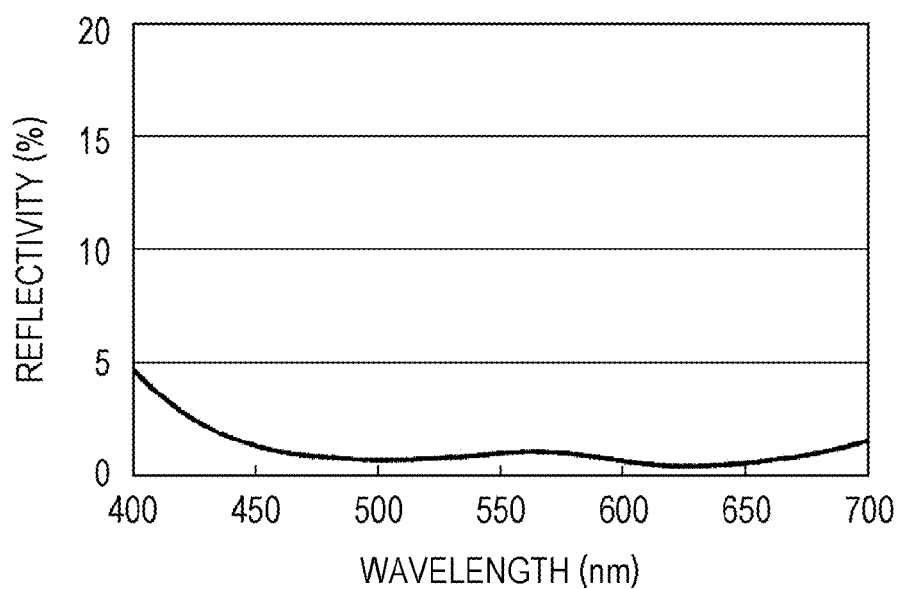
FIG. 39 is a graph of reflectivity in the wavelengths of 400 nm to 700 nm in Example 1 according to the present invention.

Sample 1 was prepared such that a dielectric layer was formed of $SiO_2$; a blackening layer was formed of CuNO; and the dielectric layer and the blackening layer respectively had thicknesses of 66.8 nm and 40.1 nm. As illustrated in FIG. 36, in the wavelengths of 400 nm to 700 nm, the extinction coefficient k of CuNO of Sample 1 was found to be 1.17 to 1.38. In addition, as illustrated in FIG. 39, in the wavelengths of 400 nm to 700 nm, the reflectivity of Sample 1 was found to be 0.4% to 4.8%. Observation of a SEM photograph revealed that the edge portions of the blackening layer had a linear etching pattern.

Comparative Example 1

Figure 40:
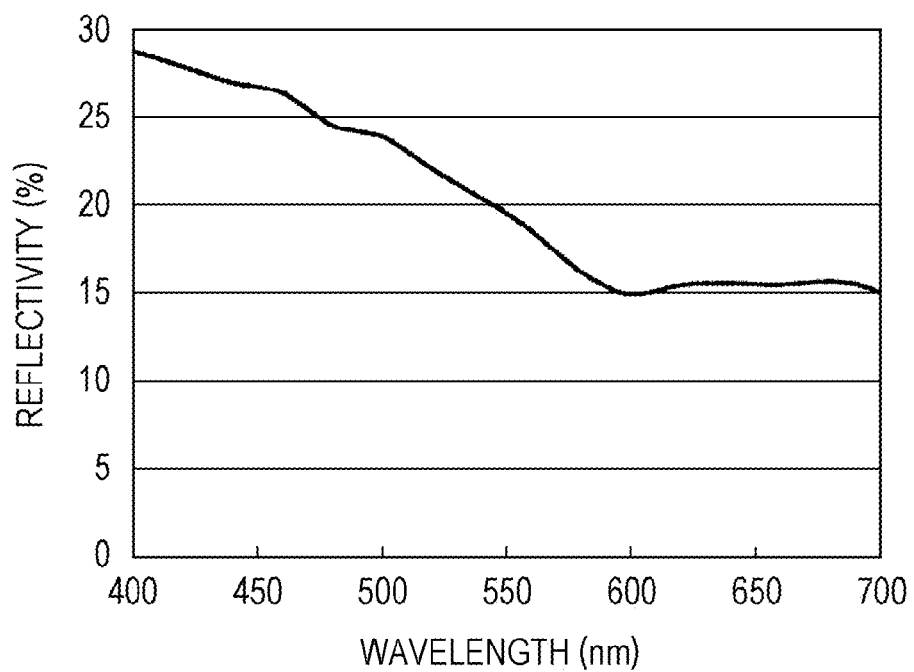
FIG. 40 is a graph of reflectivity in the wavelengths of 400 nm to 700 nm in Comparative Example 1 according to the present invention.

Sample 2 without a dielectric layer was prepared so as to have a CuNO blackening layer having a thickness of 40 nm. As illustrated in FIG. 37, in the wavelengths of 400 nm to 700 nm, the extinction coefficient k of CuNO of Sample 2 was found to be 1.26 to 1.57. However, as illustrated in FIG. 40, in the wavelengths of 400 nm to 700 nm, the reflectivity of Sample 2 was found to be 15.0% to 28.7%. Observation of a SEM photograph revealed that the edge portions of the blackening layer had a linear etching pattern.

Comparative Example 2

Figure 41:
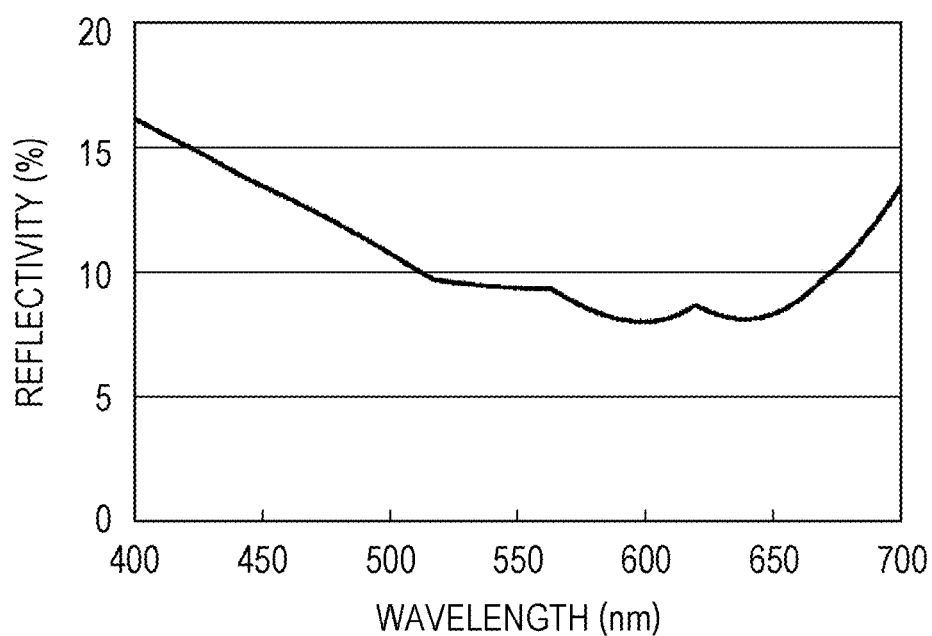
FIG. 41 is a graph of reflectivity in the wavelengths of 400 nm to 700 nm in Comparative Example 2 according to the present invention.

Sample 3 was prepared such that a dielectric layer was formed of $SiO_2$; a blackening layer was formed of CuO; and the dielectric layer and the blackening layer respectively had thicknesses of 10 nm and 39.9 nm. As illustrated in FIG. 38, in the wavelengths of 400 nm to 700 nm, the extinction coefficient k of CuO of Sample 3 was found to be 0.31 to 0.81. In addition, as illustrated in FIG. 41, in the wavelengths of 400 nm to 700 nm, the reflectivity of Sample 3 was found to be 8.0% to 16.1%. Observation of a SEM photograph revealed that the edge portions of the blackening layer had a meandering pattern.

Comparative Example 3

Figure 42:
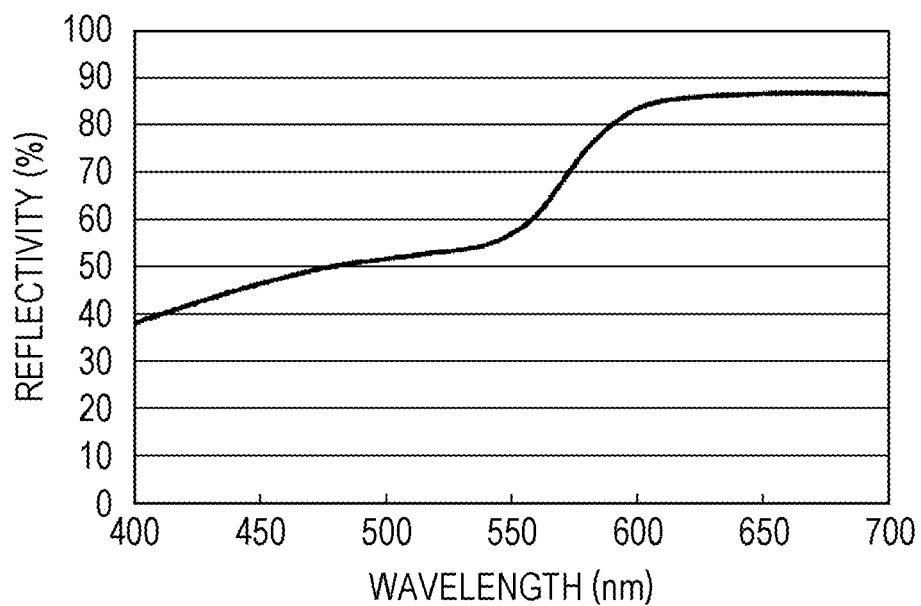
FIG. 42 is a graph of reflectivity in the wavelengths of 400 nm to 700 nm in Comparative Example 3 according to the present invention.

Sample 4 without a dielectric layer or a blackening layer was prepared. The extinction coefficient k, which is a value of a blackening layer, was not measured. As illustrated in FIG. 42, in the wavelengths of 400 nm to 700 nm, the reflectivity of Sample 4 was found to be 38.1% to 87.2%. Observation of a SEM photograph revealed that the edge portions of the Cu layer had a linear etching pattern; this was provided because only the Cu layer was formed on the substrate.

Comparative Example 4

Figure 43:
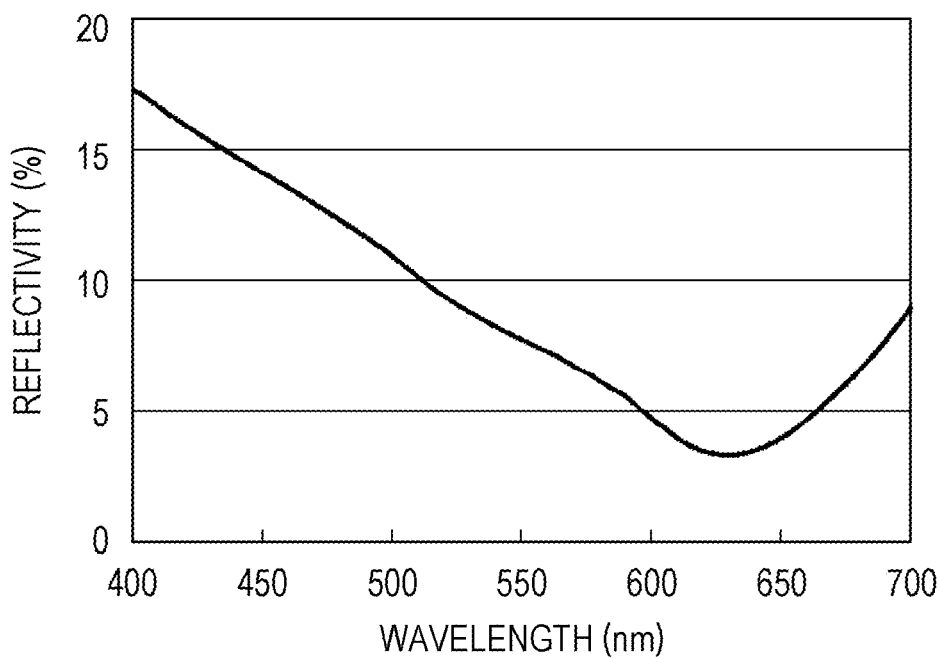
FIG. 43 is a graph of reflectivity in the wavelengths of 400 nm to 700 nm in Comparative Example 4 according to the present invention.

Sample 5 without a dielectric layer was prepared so as to have a CuO blackening layer having a thickness of 30 nm. As illustrated in FIG. 38, in the wavelengths of 400 nm to 700 nm, the extinction coefficient k of CuO of Sample 5 was found to be 0.31 to 0.81. However, as illustrated in FIG. 43, in the wavelengths of 400 nm to 700 nm, the reflectivity of Sample 5 was found to be 3.3% to 17.3%. Observation of a SEM photograph revealed that the edge portions of the blackening layer had a meandering pattern.

Comparative Example 5

Figure 44:
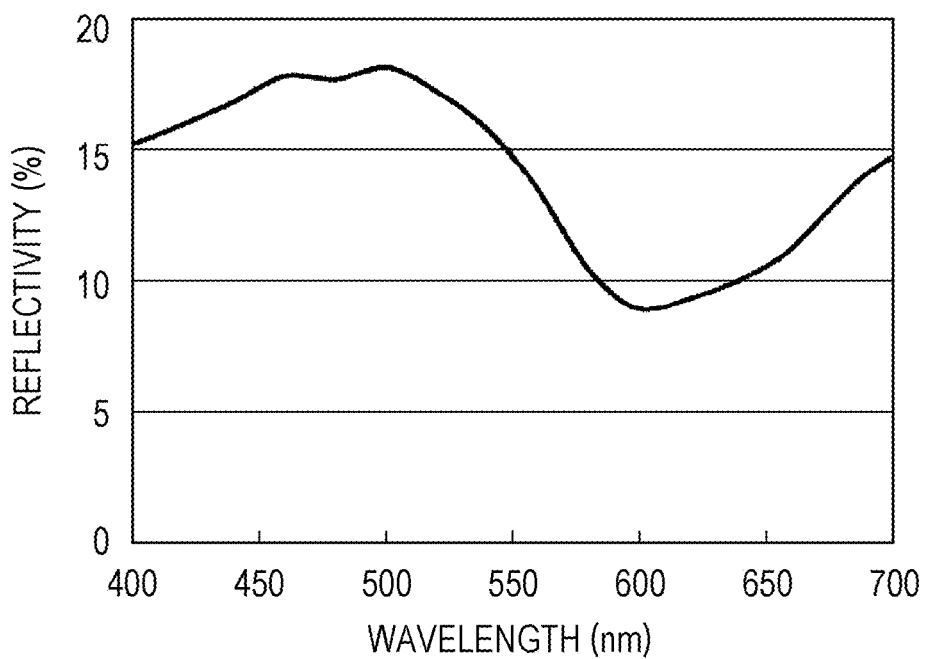
FIG. 44 is a graph of reflectivity in the wavelengths of 400 nm to 700 nm in Comparative Example 5 according to the present invention.

Sample 6 without a dielectric layer was prepared so as to have a CuN blackening layer having a thickness of 30 nm. As illustrated in FIG. 44, in the wavelengths of 400 nm to 700 nm, the reflectivity of Sample 6 was found to be 9.0% to 18.3%. Observation of a SEM photograph revealed that the edge portions of the blackening layer had a meandering pattern.

Comparative Example 6

Figure 45:
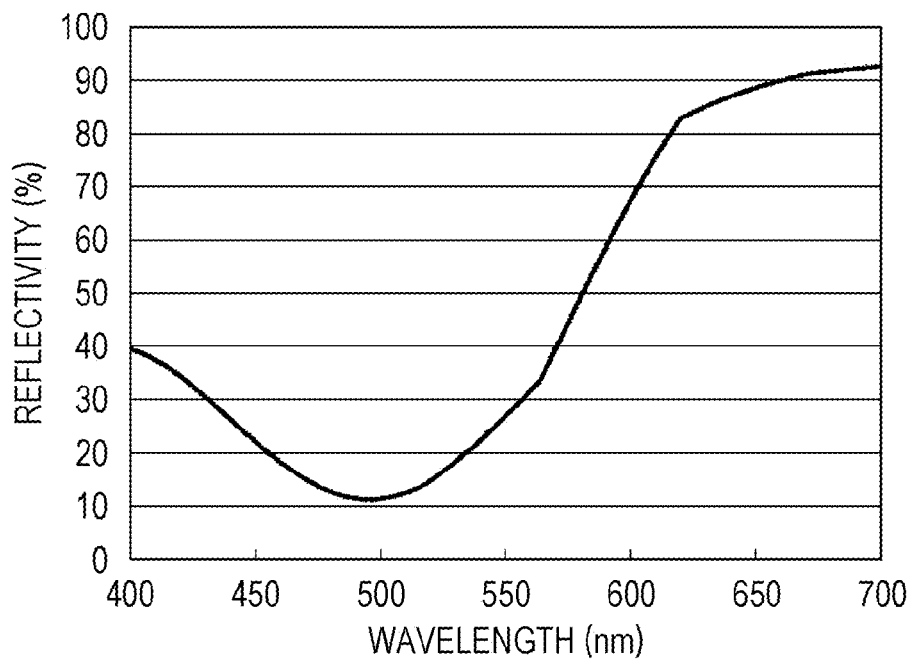
FIG. 45 is a graph of reflectivity in the wavelengths of 400 nm to 700 nm in Comparative Example 6 according to the present invention.

Sample 7 without a blackening layer was prepared so as to have a dielectric layer constituted by 170.5 nm $SiO_2$ and 29.5 nm $TiO_2$. The extinction coefficient k of $SiO_2$ and $TiO_2$ was found to be 0. As illustrated in FIG. 45, in the wavelengths of 400 nm to 700 nm, the reflectivity of Sample 7 was found to be 11.5% to 89.1%. Observation of a SEM photograph revealed that the edge portions of the Cu layer had a linear etching pattern; this was provided because only Cu was etched and then the dielectric layer was formed.

Comparative Example 7

Figure 46:
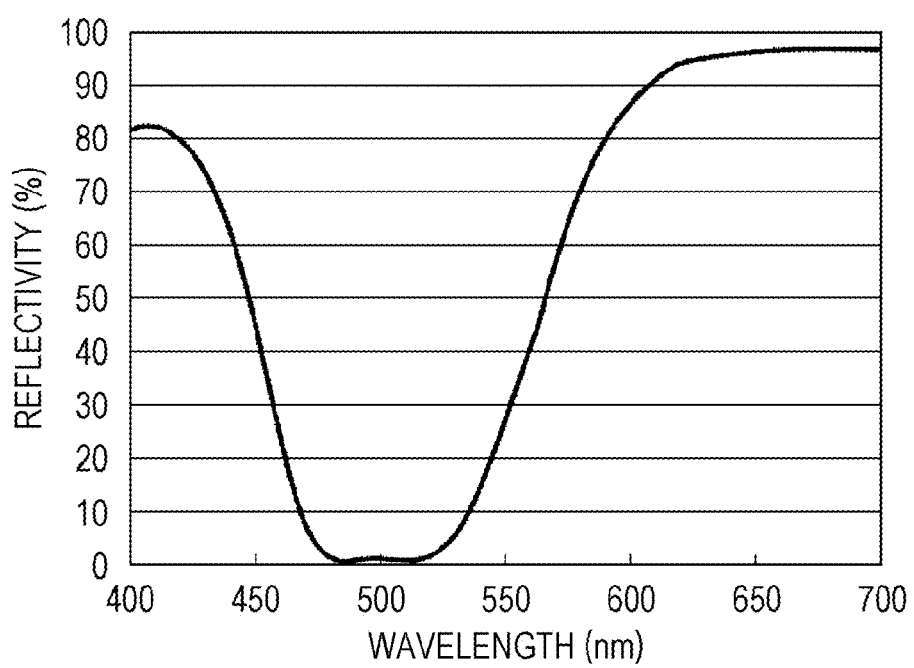
FIG. 46 is a graph of reflectivity in the wavelengths of 400 nm to 700 nm in Comparative Example 7 according to the present invention.

Sample 8 without a blackening layer was prepared so as to have a dielectric layer of a stack of eight layers in total in which four $SiO_2$ layers and four $TiO_2$ layers were alternately stacked. The extinction coefficient k of $SiO_2$ and $TiO_2$ was found to be 0. As illustrated in FIG. 46, in the wavelengths of 400 nm to 700 nm, the reflectivity of Sample 8 was found to be 0.6% to 96.5%. Observation of a SEM photograph revealed that the edge portions of the Cu layer had a linear etching pattern; this was provided because only Cu was etched and then the dielectric layer was formed.

Comparative Example 8

Figure 47:
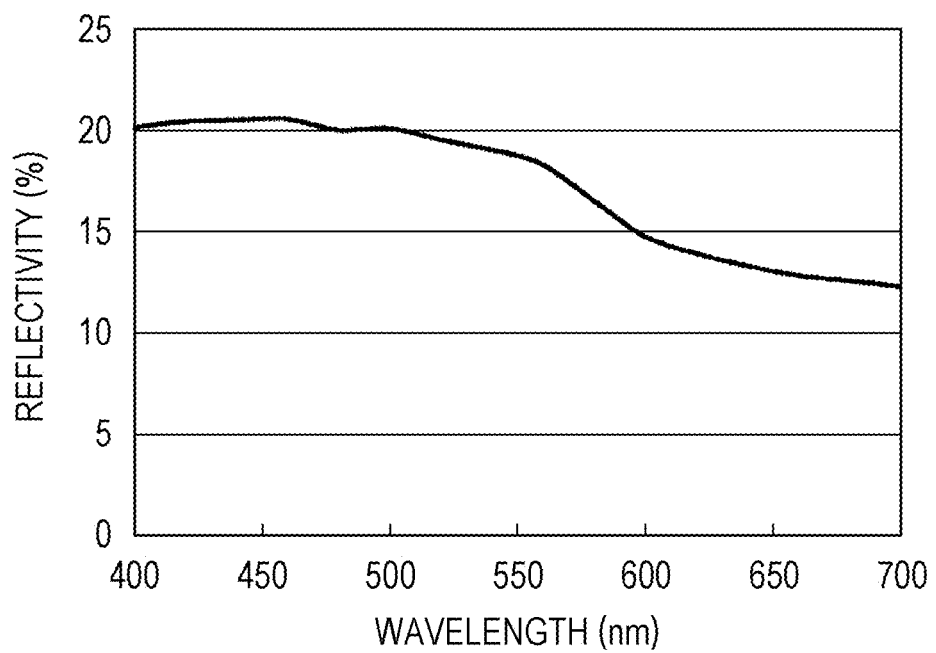
FIG. 47 is a graph of reflectivity in the wavelengths of 400 nm to 700 nm in Comparative Example 8 according to the present invention.

Sample 9 without a dielectric layer was prepared so as to have a NiCu blackening layer having a thickness of 35 nm. As illustrated in FIG. 47, in the wavelengths of 400 nm to 700 nm, the reflectivity of Sample 9 was found to be 12.3% to 20.6%. Observation of a SEM photograph revealed that the edge portions of the blackening layer had a meandering pattern.

The above-described test results have demonstrated that, a CuNO-based blackening layer that is etched at a rate close to that for the Cu layer is used as the blackening layer, to thereby provide a linear etching pattern in which the Cu layer and the CuNO-based blackening layer have widths close to each other. In addition, it has been concluded that both of a dielectric layer and a CuNO-based blackening layer having an extinction coefficient of 1.0 or more in the visible-radiation wavelength region of 400 nm to 700 nm are formed to constitute a layered structure, to thereby achieve a reflectivity of 5% or less over the entirety of the wavelength region.

REFERENCE SIGNS LIST 1 substrate
2, 2a, and 2b CuNO-based blackening layers
2c and 2d conventional blackening layers
3 Cu layer
4 photoresist layer
5 protective layer
6 layered film
50 sputtering apparatus
51 sealed housing
52 substrate unwinding reel
53 substrate winding reel
54 partition
55 first chamber
56 second chamber
57 third chamber
58 Cu target material
59 inlet
60 inlet
61 pinch rolls
62 internal drum
63 pinch rolls
64 lead wire
65 controller
66 low-vacuum suction port
67 high-vacuum suction port
21 substrate
22, 22a, and 22b Cu layers
23, 23a, and 23b CuNO-based blackening layers
24, 24a, 24b, 24c, 24d, 25, 25a, and 25b dielectric layers
210 resist layers
250 sputtering apparatus
251 sealed housing
252 substrate unwinding reel
253 substrate winding reel
254 partition
255 first chamber
256 second chamber
257 Cu target material
258 and 259 inlets
260 pinch rolls
261 internal drum
262 pinch rolls
263 lead wire
264 controller
265 low-vacuum suction port
266 high-vacuum suction port

The invention claimed is:

1. An electrical device comprising:
a substrate;
a patterned layered film in which, on one main surface of the substrate, a first Cu layer and a first CuNO blackening layer having an extinction coefficient of 1.0 or more and 1.8 or less in wavelengths of 400 nm to 700 nm are sequentially formed; and
a $SiO_2$ layer that is a first dielectric layer formed on the substrate and on the patterned layered film, and having a refractive index different from a refractive index of the first CuNO blackening layer,
wherein the electrical device has a reflectivity of 5% or less,
the first Cu layer is in direct contact with the first CuNO blackening layer,
the patterned layered film further comprises a second CuNO blackening layer between the substrate and the first Cu layer,
the electrical device further comprises a second dielectric layer on the one main surface of the substrate,
the second dielectric layer, the second CuNO blackening layer, the first Cu layer and the first CuNO blackening layer are sequentially formed on the one main surface of the substrate, and
a the material of the second dielectric layer includes one selected from a group consisting of $TiO_2$, $Ta_2O_5$, $Nb_2O_5$, $ZrO_2$, $HfO_2$, $La_2O_3$, $Cr_2O_3$, $CeO_2$, $Y_2O_3$, ZnO, ITO, SiO and $Si_3N_4$.

2. An electrical device comprising:
a substrate;
a patterned layered film in which, on one main surface of the substrate, a first Cu layer and a first CuNO blackening layer having an extinction coefficient of 1.0 or more and 1.8 or less in wavelengths of 400 nm to 700 nm are sequentially formed; and
a $SiO_2$ layer that is a first dielectric layer formed on the substrate and on the patterned layered film, and having a refractive index different from a refractive index of the first CuNO blackening layer, wherein the electrical device has a reflectivity of 5% or less, the first Cu layer is in direct contact with the first CuNO blackening layer, the patterned layered film further comprises a second CuNO blackening layer between the substrate and the first Cu layer, the electrical device further comprises a second dielectric layer on the one main surface of the substrate, the second dielectric layer, the second CuNO blackening layer, the first Cu layer and the first CuNO blackening layer are sequentially formed on the one main surface of the substrate, and a material of the second dielectric layer includes $TiO_2$.

* * * * *